United States Patent
Siivola et al.

(10) Patent No.: US 9,601,677 B2
(45) Date of Patent: Mar. 21, 2017

(54) THERMOELECTRIC (TE) DEVICES/STRUCTURES INCLUDING THERMOELECTRIC ELEMENTS WITH EXPOSED MAJOR SURFACES

(75) Inventors: Edward P. Siivola, Raleigh, NC (US); Ramaswamy Mahadevan, Chapel Hill, NC (US)

(73) Assignee: Laird Durham, Inc., Durham, NC (US)

( * ) Notice: Subject to any disclaimer, the term of this patent is extended or adjusted under 35 U.S.C. 154(b) by 1321 days.

(21) Appl. No.: 13/048,191

(22) Filed: Mar. 15, 2011

(65) Prior Publication Data
US 2011/0220162 A1 Sep. 15, 2011

Related U.S. Application Data

(60) Provisional application No. 61/313,915, filed on Mar. 15, 2010.

(51) Int. Cl.
*H01L 35/32* (2006.01)

(52) U.S. Cl.
CPC .................. *H01L 35/32* (2013.01)

(58) Field of Classification Search
CPC ........................................ H01L 35/32
See application file for complete search history.

(56) References Cited

U.S. PATENT DOCUMENTS

| | | | |
|---|---|---|---|
| 3,136,134 A | 6/1964 | Smith | |
| 3,296,034 A | 1/1967 | Reich | |
| 3,607,444 A | 9/1971 | Debucs | |
| 3,615,870 A | 10/1971 | Crouthamel | |
| 3,663,307 A | 5/1972 | Mole | |
| 3,859,143 A | 1/1975 | Krebs | |
| 4,443,650 A | 4/1984 | Takagi et al. | |
| 4,459,428 A | 7/1984 | Chou | |
| 4,468,854 A | 9/1984 | Chou et al. | |
| 4,855,810 A | 8/1989 | Gelb et al. | |
| 4,971,632 A * | 11/1990 | Rowe | H01L 35/18 136/212 |
| 5,006,178 A | 4/1991 | Bijvoets | |

(Continued)

FOREIGN PATENT DOCUMENTS

| | | |
|---|---|---|
| EP | 0 687 020 | 12/1995 |
| EP | 0 805 501 A1 | 11/1997 |

(Continued)

OTHER PUBLICATIONS

The Oxford English Dictionary "primary, adj. and n." OED Online. Oxford University Press, Dec. 2015. Web. Mar. 2, 2016.*

(Continued)

*Primary Examiner* — Magali P Slawski
(74) *Attorney, Agent, or Firm* — Myers Bigel & Sibley, PA

(57) ABSTRACT

A thermoelectric structure may include a thermally conductive substrate, and a plurality of thermoelectric elements arranged on a surface of the thermally conductive substrate. Moreover, each thermoelectric element may be non-parallel and non-orthogonal with respect to the surface of the thermally conductive substrate. For example, each of thermoelectric elements may be a planar thermoelectric element, and a plane of each of the thermoelectric elements may be oriented obliquely with respect to the surface of the thermally conductive substrate.

19 Claims, 15 Drawing Sheets

(56) References Cited

U.S. PATENT DOCUMENTS

| | | | |
|---|---|---|---|
| 5,228,923 A * | 7/1993 | Hed | 136/208 |
| 5,254,178 A | 10/1993 | Yamada et al. | |
| 5,429,680 A | 7/1995 | Fuschetti | |
| 5,430,322 A | 7/1995 | Koyanagi et al. | |
| 5,837,929 A | 11/1998 | Adelman | |
| 5,865,975 A | 2/1999 | Bishop | |
| 5,869,242 A | 2/1999 | Kamb | |
| 5,874,219 A | 2/1999 | Rava et al. | |
| 5,900,071 A | 5/1999 | Harman | |
| 5,922,988 A | 7/1999 | Nishimoto | |
| 5,950,067 A | 9/1999 | Maegawa et al. | |
| 6,060,331 A | 5/2000 | Shakouri et al. | |
| 6,060,657 A | 5/2000 | Harman | |
| 6,062,681 A | 5/2000 | Field et al. | |
| 6,071,351 A | 6/2000 | Venkatasubramanian | |
| 6,072,925 A | 6/2000 | Sakata | |
| 6,084,050 A | 7/2000 | Ooba et al. | |
| 6,094,919 A | 8/2000 | Bhatia | |
| 6,100,463 A | 8/2000 | Ladd et al. | |
| 6,154,266 A | 11/2000 | Okamoto et al. | |
| 6,154,479 A | 11/2000 | Yoshikawa et al. | |
| 6,162,985 A | 12/2000 | Parise | |
| 6,180,351 B1 | 1/2001 | Cattell | |
| 6,271,459 B1 | 8/2001 | Yoo | |
| 6,282,907 B1 | 9/2001 | Ghoshal | |
| 6,300,150 B1 | 10/2001 | Venkatasubramanian | |
| 6,365,821 B1 | 4/2002 | Prasher | |
| 6,384,312 B1 | 5/2002 | Ghoshal et al. | |
| 6,388,185 B1 | 5/2002 | Fleurial et al. | |
| 6,403,876 B1 | 6/2002 | Ghoshal et al. | |
| 6,410,971 B1 | 6/2002 | Otey | |
| 6,412,286 B1 | 7/2002 | Park et al. | |
| 6,452,206 B1 | 9/2002 | Harman et al. | |
| 6,505,468 B2 | 1/2003 | Venkatasubramanian | |
| 6,605,772 B2 | 8/2003 | Harman et al. | |
| 6,696,635 B2 | 2/2004 | Prasher | |
| 6,729,143 B1 * | 5/2004 | Watts et al. | 62/3.2 |
| 6,800,933 B1 | 10/2004 | Mathews et al. | |
| 7,164,077 B2 | 1/2007 | Venkatasubramanian | |
| 7,235,735 B2 | 6/2007 | Venkatasubramanian | |
| 7,855,397 B2 | 12/2010 | Alley et al. | |
| 2001/0002319 A1 * | 5/2001 | Tauchi | C30B 1/12 438/54 |
| 2001/0052234 A1 | 12/2001 | Venkatasubramanian | |
| 2002/0024154 A1 * | 2/2002 | Hara | H01L 23/38 257/712 |
| 2002/0046762 A1 | 4/2002 | Rossi | |
| 2002/0053359 A1 | 5/2002 | Harman et al. | |
| 2002/0069906 A1 | 6/2002 | Macris | |
| 2002/0139123 A1 * | 10/2002 | Bell | 62/3.7 |
| 2003/0099279 A1 | 5/2003 | Venkatasubramanian | |
| 2003/0168094 A1 * | 9/2003 | Miyasita | H01L 35/34 136/240 |
| 2003/0209014 A1 | 11/2003 | Chang et al. | |
| 2003/0230332 A1 | 12/2003 | Venkatasubramanian et al. | |
| 2004/0069339 A1 * | 4/2004 | Dai | H01L 35/30 136/203 |
| 2004/0113076 A1 | 6/2004 | Guo et al. | |
| 2004/0261830 A1 | 12/2004 | Sharp et al. | |
| 2005/0045702 A1 | 3/2005 | Freeman et al. | |
| 2005/0115600 A1 * | 6/2005 | DeSteese | H01L 35/34 136/205 |
| 2005/0178424 A1 | 8/2005 | Yotsuhashi et al. | |
| 2006/0086118 A1 | 4/2006 | Venkatasubramanian | |
| 2006/0097383 A1 | 5/2006 | Ramanathan et al. | |
| 2006/0128059 A1 | 6/2006 | Ahn et al. | |
| 2006/0289050 A1 | 12/2006 | Alley et al. | |
| 2006/0289052 A1 | 12/2006 | O'Quinn et al. | |
| 2007/0012938 A1 | 1/2007 | Yu et al. | |
| 2007/0028956 A1 | 2/2007 | Venkatasubramanian | |
| 2007/0089773 A1 | 4/2007 | Koester et al. | |
| 2007/0120250 A1 | 5/2007 | Fairchild et al. | |
| 2007/0215194 A1 | 9/2007 | Bharathan et al. | |
| 2007/0261730 A1 * | 11/2007 | Seker | H01L 35/30 136/224 |
| 2008/0079109 A1 * | 4/2008 | Luo | H01L 35/34 257/470 |
| 2008/0271771 A1 * | 11/2008 | Takahashi | 136/203 |
| 2009/0000652 A1 | 1/2009 | von Windheim et al. | |
| 2009/0057928 A1 | 3/2009 | Zhai et al. | |
| 2009/0072385 A1 | 3/2009 | Alley et al. | |
| 2010/0252087 A1 | 10/2010 | Deane et al. | |
| 2011/0146740 A1 * | 6/2011 | St. Rock | H01L 35/32 136/201 |

FOREIGN PATENT DOCUMENTS

| | | |
|---|---|---|
| EP | 0 805 501 B1 | 11/1997 |
| FR | 2 320 637 A1 | 3/1977 |
| GB | 2 171 254 A | 8/1986 |
| JP | 6-97512 | 4/1994 |
| JP | 2002-111080 | 4/2002 |
| JP | 2002-232028 | 8/2002 |
| WO | WO 98/43740 | 10/1998 |
| WO | WO 98/44562 | 10/1998 |
| WO | WO 99/38219 | 7/1999 |
| WO | WO 00/49664 | 8/2000 |
| WO | WO 01/08800 | 2/2001 |
| WO | WO 2004/049463 | 6/2004 |
| WO | WO 2005/074463 | 8/2005 |
| WO | WO 2006/049285 A2 | 5/2006 |
| WO | WO 2006/049285 A3 | 5/2006 |

OTHER PUBLICATIONS

FerroTec "Thermoelectric Technical Reference—Basic Principles of Thermoelectric Materials" https://www.ferrotec.com/technology/thermoelectric/thermalref02/ Accessed Mar. 3, 2016.*

Development of Low-Bandgap Ge and $Sl_{0.07}Ge_{0.03}$ Solar Cells for Monolithic and Mechanically-Stacked Cascade Applications, Rama Venkatasubramanian et al., pp. 73-78.

Fields, S., Proteomics in Genomeland, Science vol. 291 No. 5507 pp. 1221-1224, pp. 1-7.

Graded-Band-GAP AlGaAs Solar Cells for AlGaAs/Ge Cascade Cells, M.L. Timmons, et al., pp. 68-72.

Fitch, J. Patrick, Bahrand Sokhansanj, IEEE, Genomic Engineering: Moving Beyond DNA Sequence to Function, Proceedings of the IEEE, vol. 88, No. 12, Dec. 2000, pp. 1949-1971.

Hofmeister, Rudolf et al., New Photorefractive Mechanism in Centrosymmetric Crystals: A Strain-Coordinated Jahn-Teller Relaxation, Physical Review Letters, vol. 69, No. 9, Aug. 31, 1992, pp. 1459-1462.

Samuel K. Moore, Making Chips, IEEE Spectrum, Biotechnology, Mar. 2001, pp. 54-60.

Photoexcited Carrier Lifetimes and Spatial Transport in Surface-free GaAS Homostructures, L.M. Smith et al., J. Vac. Sci. Technol. B, vol. 8, No. 4 Jul./Aug. 1990, pp. 787-792.

Ideal Electronic Properties of a p-Ge/p-$Al_{0.85}Ga_{0.15}$As Interface, Rama Venkatasubramanian et al., Appl. Phys. Lett., vol. 59, No. 3, Jul. 15, 1991, pp. 318-320.

Selective Plasma Etching of Ge Substrates for Thin Freestanding GaAs-AlGaAs Heterostructures, Rama Venkatasubramanian et al., Appl. Phys. Lett., vol. 59, No. 17, Oct. 21, 1991, pp. 2153-2155.

Visible Light Emission From Quantized Planar Ge Structures, Rama Venkatasubramanian et al., Appl. Phys. Lett., vol. 59, No. 13, Sep. 23, 1991, pp. 1603-1605.

GaInAsP Lattice Matched to GaAs for Solar Cell Applications, P.R. Sharps, et al., Research Triangle Institute, P.O. Box 12194, RTP, NC 27709. pp. 315-317.

High-Temperature Performance and Radiation Resistance of High-Efficiency Ge and $Si_{0.07}Ge_{0.03}$ Solar Cells on Lightweight Ge Substrates, Rama Venkatasubramanian et al., pp. 85-89.

Physical Basis and Characteristics of Light Emission From Quantized Planar Ge Structures, Rama Venkatasubramanian, et al., pp. 15.4.1-15.4.4.

(56) References Cited

OTHER PUBLICATIONS

High Quality GaAs on Si Using $Si_{0.04}Ge_{0.96}$/Ge Buffer Layers, Rama Venkatasbramanian, et al., Journal of Crystal Growth 107 (1991) pp. 489-493.

The New Face of A.I., Michael Powell, Merger Maniac Europe's CD Underworld, The Supercheap Future of Flying, Mar. 2002, Hacking the Racetrack, Insife Nuke University, Wired, A New Kind of Cool, Rama Venkatasubramanian.

Optimization of the Heteroepitaxy of Ge on GaAs for Minority-Carrier Lifetime, Rama Venkatasubramanian, et al., Jouranl of Crystal Growth 112 (1991) pp. 7-13, Received Aug. 9, 1990; manuscript received in final form Dec. 14, 1990.

Intrinsic Recombination and Interface Characterization in "surface-free" GaAs Structures, D.J. Wolford et al., J. Vac. Sci. Technol. B. vol. 9, No. 4, Jul./Aug. 1991, pp. 2369-2376.

Advances in the Development of an AlGaAs/GaAs Cascade Solar Cell Using a Patterned Germanium Tunnel Interconnect, Rama Venkatasubramanian et al., pp. 345-354.

High-Quality Eutectic-Metal-Bonded AlGaAs-GaAs Thin Films on Si Substrates, Rama Venkatasubramanian et al., Appl. Phys. Lett., vol. 60, No. 7, Feb. 17, 1992, pp. 886-888.

Photoluminescence of Porous Silicon Buried Underneath Epitaxial GaP, J.C., Campbell, et al., Appl. Phys. Lett., vol. 60, No. 7, Feb. 17, 1992, pp. 889-891.

Interface-Free GaAs Structures—From Bulk to the Quantum Limit, D.J. Wolford, et al, Inst. Phys. Conf. U.S. Appl. No. 120: Chapter 9, pp. 401-406.

Properties and Use of Cycled Grown OMVPE GaAs: Zn, GaAS:Se, and GaAS:Si Layers for High-Conductance GaAS Tunnel Junctions, Rama Venkatasubramanian et al., National Renewable Energy Laboratory, Golden, CO 80401, pp. 893-899.

Thermal Characterization of $Bi_2$, $Te_3$/$Sb_2$ $Te_3$ Superlattices, M.N. Touzelbaev and P. Zhou, Department of Mechanical Engineering, Stanford University, Stanford, California 94305-3030, Rama Venkatasubramanian, Center for Semiconductor Research, Research Triangle Institute, Research Triangle Park, Durham, NC 27709-2195, K.E. Goodson Electronic mail goodson@vk.stanford.edu, Journal of Applied Physics, vol. 90, No. 2, Jul. 15, 2001, pp. 763-767.

Smaller, Faster, Efficient Thermoelectric Cooling, Rama Venkatasubramanian, vol. 30, No. 41, Oct. 17, 2001 ISSN: 0300-757X, pp. 1-2.

CVD Diamond for Components and Emitters, J. Davidson, Corresponding Author, e-mail address: jld@vuse.vanderbilt.edu (J. Davidson) et al., Vanderbilt University 2201 West End Avenue, Nashville, TN 37235, USA, Diamond and Related Materials 10 (2001) pp. 1736-1742.

Sneak Preview, Optical Device Transfers Data Fast, Rama Venkatasubramanian, design news Dec. 17, 2001. p. 14.

Lattice Thermal Conductivity Reduction and Phonon Localization-like Behavior in Superlattice Structures, Rama Venkatasubramanian, Research Triangle Institute, Research Triangle Park, North Carolina 27709, Physical Review B., vol. 61, No. 4, Jan. 15, 2000-II, pp. 3091-3097.

Phonon-Blocking Electron-Transmitting Structures, Rama Venkatasubramanian et al., Research Triangle Institute, Research Triangle Park, NC, USA, 18 International Conference on Thermoelectric (1999), pp. 100-103.

Magnetoresistance Technique for Determining Cross-Plane Mobility in Superlattice Devices, S.W. Johnson et al., National Renewable Energy Laboratory, Golden, CO, USA, Research Triangle Institute, Research Triangle Park, NC, USA, 18th International Conference on Thermoelectrics (1999), pp. 675-678.

Optical Properties of Bi2Te3 Grown by Metalorganic Vapor Phase Epitaxy, Hao Chu, et al., Electrical, Computer & Systems Engineering Dept., Rensselaer Polytechnic Institute, Troy, NY, USA, Research Triangle Institute, Research Triangle Park, NC, USA; 18th International Conference on Thermoclectrics (1999), pp. 683-686.

RTI Research Yields Major Advance in Thermoelectrics, Rama Venkatasubramanian et al., pp. 8-9.

RTI International, "New Thermoelectric Materials Can Keep Chips Cool Advances in Fiber Optics and in Biotechnology also are Likely" Oct. 9, 2001.

RTI International Annual Report 2001, Turning Knowledge into Practice, pp. 4-37.

Cooling Film Tempers Tiny Hot Spots, Rama Venkatasubramanian et al, Science News, No. 3, 2001, v160, i18, p. 280.

Phonon Blocking Electron Transmitting Superlattice Structures as Advanced Thin Film Thermoelectric Materials, Rama Venkatasubramanian, Research Triangle Institute, Research Triangle Park, NC, Chapter 4, Semiconductors and Semimetals, vol., pp. 175-201.

Improved Photoluminescence of GaAs in ZnSe/GaAs Heterojunctions grown by Organometallic Epitaxy, S.K. Ghandhi et al., Electrical Computer, and Systems Engineering Department, Rensselaer Polytechnic Institute, Troy, New York 12180, Appl. Phys. Lett. vol. 53 No. 14, Oct. 3, 1988, pp. 1308-1310.

Epitaxy of Germanium using Germane in the Presence of Tetramethylgermanium, Rama Venkatasubramanian et al., Research Triangle Institute, P.O. Box 12194, Research Triangle Park, NC, 27709, J. Appl. Phys. vol. 66, No. 11, Dec. 1, 1989, pp. 5662-5664.

Radiative Recombination in Surface free $n^+In^-In^+GaAs$ Homostructures, L.M. Smith and D.J. Wolford et al., Appl. Phys. Lett., vol. 57, No. 15, Oct. 8, 1990, pp. 1572-1574.

Measurement of Al/GaAs/AlGaAs Interface Recombination Velocities Using Time-Resolved Photoluminescence, M.L. Timmons, et al., Appl. Phys. Lett. vol. 56, No. 19, May 7, 1990, pp. 1850-1852.

Thin-Film Thermoelectric Devices with High Room-Temperature Figures of Merit, Rama Venkatasubramanian et al., Research Triangle Institute, Research Triangle Park, North Carolina 27709, USA, 2001 Macmillian Magazines Lt., Nature, vol. 413, Oct. 11, 2001, www.nature.com pp. 597-602.

In-situ Monitoring of the Growth of $Bi_2$ $Te_3$ and $Sb_2$ $Te_3$ Superlattice Using Spectroscopic Ellipsometry Hao Cui et al. Journal of Electronic Materials, vol. 30, No. 11 2001, Special Issue Paper, pp. 1376-1381.

Incorporation Processes in MBE Growth of ZnSe, Rama Venkatasubramanian et al., Jouranl of Crystal Growth 95 (1989) pp. 533-537.

An Inverted-Growth Approach to Development of an IR-Transparent, High-Efficiency AiGaAs/GaAs Cascade Solar Cell, Rama Venkatasubramanian, M.L. Timmons, T.S. Colpitts, J.S. Hills, and J.A. Hutchby, Research Triangle Institute, Research Triangle Park, NC 27709, 1991 IEEE pp. 93-98.

15.8%-Efficient (1-SUN, AM 1.5G) GaAs Solar Cell on Optical-Grade Polycrystalline Ge Substrate, Rama Venkatasubramanian et al., pp. 691-695.

Development of 20% Efficient GainAsP Solar Cells, P.R. Sharps, et. al., 1993 IEEE pp. 633-638.

Development of High-Efficiency $Al_{0.2}Ga_{0.8}As$ Solar Cells and Interconnect Schemes for $Al_{0.2}Ga_{0.3}As$/Si Mechanically-Stacked Cascade Cells, Rama Venkatasubramanian, et al., 1993 IEEE pp. 752-756.

Photorefledtance Charaterization of IhP and GaAs Solar Cells, R.G. Rodrigues et al., 1993 IEEE pp. 681-685.

Close-Packed Cell Arrays for Dish Concentrators, J.B. Lasich et al., Solar Research Corporation Pty. Ltd., 6 Luton Lane, Hawthorn, Victoria 3122, Australia and M. Timmons et al., Research Triangle Institute, RTP, USA, 1994 IEEE pp. 1938-1941.

GaAs and $Al_{0.2}Ga_{0.8}As$ Solar Cells With an Indirect-Bandgap $Al_{0.8}Ga_{0.2}As$ Emitter—Heterojunction Cellls, Rama Venkatasubramanian et al., Research Triangle Institute, RTP, NC 27709, H. Field and K. Emery, National Renewable Energy Laboratory (NREL), Golden, CO 80401, First WCPEC: Dec. 5-9, 1994; Hawaii, pp. 1839-1842.

The Growth and Radiation Response of $N_+p$ Deep Homojunction InP Solar Cells, M.J. Panunto et al., M.L. Timmons, et al., First WCPEC; Dec. 5-9, 1994; Hawaii, pp. 2192-2195.

Material and Device Characterization Toward High-Efficiency GaAs Solar Cells on Optical-Grade Polycrystalline Ge Substrates, Rama Venkatasubramanian, et al., R. Ahrenkiel, et. al, First WCPEC; Dec. 5-0, 1994; Hawaii, 1994 IEEE pp. 1692-1696.

(56) References Cited

OTHER PUBLICATIONS

Silicon and GAAS/GE Concentrator Power Plants: A Comparison of Cost of Energy Produced, R.A. Whisnant et al., First WCPEC; Dec. 5-9, 1994; Hawaii, 1994 IEEE pp. 1103-1106.
Compensation Mechanisms in $N_+$-GaAs Doped With Silicon, Rama Venkatasubramanian, et al., Electrical Computer, and Systems Engineering Department, Rensselaer Polytechnic Institute, Troy, New York 12180, USA, Journal of Crystal Growth 94 (1989) pp. 34-40.
High-Efficiency Tandem Solar Cells on Single-and Poly-Crystalline Substrates, J.A. Hutchby et al., Center for Semiconductor Research, Research Triangle Institute, Research Triangle Park, NC 27709, USA, Solar-Energy Materials and Solar Cells 35 (1994) pp. 9-24.
Optoelectronic Properties of Eutectic-Metal-Bonded (EMB) GaAs-AlGaAs Structures on Si Substrates, Rama Venkatasubramanian, et al., Solid-State Electronics vol. 37, No. 11, pp. 1809-1815, 1994.
Heteroepitaxy and Characterization of Ge-rich SiGe Alloys on GaAs, Rama Venkatasubramanian et al., J. Appl. Phys. vol. 69. No. 12, Jun. 15, 1991, pp. 8164-8167.
18.2% (AM1.5) Efficient GaAs Solar Cell on Optical-Grade Polycrystalline Ge Substrate, Rama Venkatasubramanian et al., $25^{th}$ PVSC; May 13-17, 1996; Washington, D.C. 1996 IEEE pp. 31-36.
Experimental Evidence of High Power Factors and Low Thermal Conductivity in $Bi_2Te_3/SB_2Te_3$ Superlattice Thin-Films, Rama Venkatasubramanian et al., Research Triangle Institute, Research Triangle Park, NC 27709, USA, $15^{th}$ International Conference on Thermoelectrics (1996), 1996 IEEE pp. 454-458.
Thermal Conductivity of Si-Ge Superlattices, S.-M. Lee and David G. Cahill[a], Rama Venkatasubramanian, Appl. Phys. Lett. vol. 70, No. 22, Jun. 2, 1997, pp. 2957-2959.
20% (AM1.5) Efficiency GaAs Solar Cells on Sub-mm Grain-Size Poly-Ge and Its Transition to Low-Cost Substrates, Rama Venkatasubramanian et al., $26^{th}$ PVSC: Sep. 30-Oct. 3, 1997; Anaheim, CA 1997 IEEE, pp. 811-814.
Electronic and Mechanical Properties of Ge Films Grown on Glass Substrates, R.K. Ahrenkiel et al., $26^{th}$ PVSC; Sep. 30-Oct. 3, 1997; Anaheim, CC, pp. 527-529.
MOCVD of $Bi_2Te_3$ and Their Superlattice Structures for Thin-Film Thermoelectric Applications, Rama Venkatasubramanian et al., Journal of Crystal Growth 170 (1997), pp. 817-821.
A Silent Cool: Thermoelectrics May Offer New Ways to Refrigerate and Generate Power, Corinna Wu, Science News, Sep. 6, 1997 v152 n10 p. 152(2), pp. 1-3.
ONR Contributes to Thermoelectric Research (Office of Naval Research) (Brief Article), Ozone Depletion Network Online Today, Contact ONR, website http://www.onr.navy.mil., Nov. 2001.
In-Plane Thermoelectric Properties of Freestanding Si/Ge Superlattice Structures, Rama Venkatasubramanian et al., $17^{th}$ International Conference on Thermoelectrics (1998), pp. 191-197.
Potential of Si-based Superlattice Thermoelectric Materials for Integration with Si Microelectronics, Rama Venkatasubramanian et al., 1998 IEEE, p. 869.
Low-temperature Organometallic Epitaxy and Its Application to Superlattice Structures in Thermoelectrics, Rama Venkatasubramanian, [a], et al., Sandra Liu and Nadia El-Masry, Michael Lamvik, Applied Physics Letters, vol. 75, No. 8, Aug. 23, 1999, pp. 1104-1106.
Optical Constants of $Bi_2Te_3$ and $Sb_2Te_3$ Measured Using Spectroscopic Ellipsometry, HAO CUI, [1]I.B. BHAT[1,3] and Rama Venkatasubramanian[2], 1-Electrical, Computer and Systems Engineering Department, Rensselaer Polytechnic Institute, Troy, NY 12180-3590, USA. 2.-Research Triangle Institute, Research Triangle Park, NC 27709, USA, 3-e-mail:bhati@.rpi.edu., Journal of Electronics Materials, vol. 28, No. 10, 1999, pp. 1111-1114.
Thin-Film Technology, Research Triangle Institute, Investment Opportunities, in Thermoelectronics, Apr. 6, 2001, website http://www.rti.org/units/es.cfm, pp. 1-2.
Nature Publishing Group, Materials Update, Cool Future for Semiconductors, Oct. 11, 2001. pp. 1-3.
Cool New Film, Science Update, Oct. 11, 2001, http//www.nature.com/nsu/011011/0111011-12.html, pp. 1-2.
Semiconductors are Cool, News and Views, Cronin B. Vining, 2001 Macmillan Magazines Ltd., Nature, vol. 413, Oct. 11, 2001, www.nature.com, pp. 577-578.
Thermoelectric Boost, Richard Babyak, Appliance Manufacturer, Design and Engineering Solutions for the Global Appliance Industry, http://www.ammagazine.com/CDA/ArticleInformation/features/BNP FeaturesItem/0.260. . . Jul. 18, 2002, pp. 1-2.
Thermoelectrics from Hot to Cool, New Technology Offers Efficient way to Heat or Cool ICS in Operation, Jeff Dorsch, Semiconductor Magazine, http://www.semi.org/web/wmagazine.nsf/4f55b97743c2d02e882565bf006c2459/27e74866ea . . . , Jun. 20, 2002. pp. 1-3.
Nanostructured Superlattice Thin-Film Thermoelectric Devices; Nanotechnology and the Environment Applications and Implications; American Chemical Society (2005) (ACS Symposium Series 890) Chapter 47, pp. 347-352.
Grove issues power warning at IEDM lunch; David Lammers (Dec. 10, 2002) http://www.eetimes.com/showArticle.jhtml?articleID=10806530,; EETIMES online.
Superlattice Thin-film Thermoelectric Materials and Devices; Rama Venkatasubramanian et al.; Mat. Res. Soc. Symp. Proc. vol. 793 (2004 Materials Research Society) pp. 51-58.
1.3 Peltier Cooling and the Thermoelectric Figure of Merit; G.S. Nolas et al.; Thermo-electrics Basic Principles and New Materials Developments; Materials Science; pp. 8-13.
IR-Mediated PCR http://faculty.virginia.edu/landers/Irframe.htm.
International Search Report and Written Opinion of the International Searching Authority corresponding to International Application No. PCT/US2010/028775; Date of Mailing: Mar. 22, 2011; 10 pages.
Press Release, Marlow Industries "New, Low-Profile Planar TEC Cools Detectors, Drives Cost Down" Apr. 29, 2008, Planar TEC, http://www.marlow.com/AboutMarlow/PressRelease/press_release_Apr_29_2008.htm.
Press Release, Marlow Industries "New, Low-Profile Planar TEC Cools Detectors, Drives Cost Down" Apr. 29, 2008, ThomasNet Industrial Newsroom, http://news.thomasnet.com/printreadycn.html?prid=816927.
Fontanazza "A Cooler Way to Stop Seizures " *Medical Device & Diagnostic Industry Magazine* pp. 1-2 (2005).
Ettenberg et al. "A New n-type and Improved p-type Pseudo-ternary $(Bi_2Te_3)(Sb_2Se_3)$ Alloy for Peltier Cooling" $15_{th}$ International Conference on Thermoelectrics, IEEE Catalog No. 96TH8169 pp. 52-56 (1996).
Kloeser "High-Performance flip chip packages with copper pillar bumping " *Global SMT & Packaging* pp. 28-31 (May 2006), www.globalsmt.net.
Rothman "Pathophysiology and therapy of epilepsy" Website of Professor Steven Rothman, M.D. of Washington University in St. Louis: http://neuroscience.wustl.edu/research/faculty.php?id=81.
Snyder et al. "Hot Spot Cooling Using Embedded Thermoelectric Coolers" 22nd IEEE Semi-Therm Symposium, IEEE Catalog No. 1-4244-0154-2 pp. 135-143 (2006).
Venkatasubramanian et al. "Phonon-Blocking Electron-Transmitting Structures" $18^{th}$ International Conference on Thermoelectrics (1999), pp. 100-103.
International Search Report and Written Opinion for PCT/US2006/024387; Oct. 22, 2007.
Rama Venkatasubramanian et al; Thin-film thermoelectric devices with high room-temperature figures of merit; Nature; vol. 413 Oct. 11, 2001; XP-001090991 pp. 597-602.
Invitation to Pay Additional Fees and Partial International Search Report for PCT/US2006/024387 mailed Jul. 26, 2007.
Kitano, Yukishige, "Crystal Structure of Polyimides. Application of Molecular Simulation Technique to Calculate the Crystal Structure", 1994, Journal of Photopolymer Science and Technology, vol. 7 No. 2, pp. 257-260.

\* cited by examiner

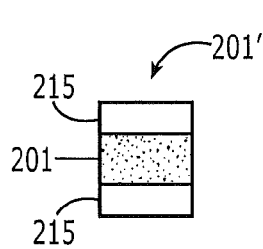 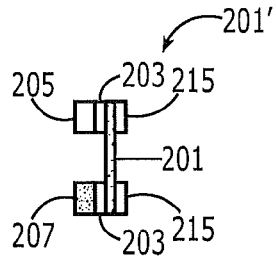 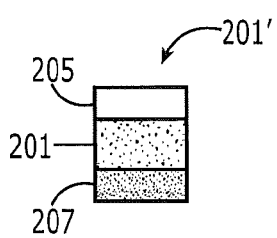
Figure 9A   Figure 9B   Figure 9C
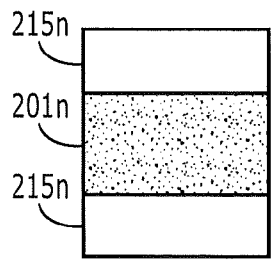 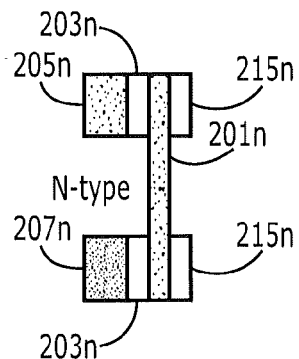 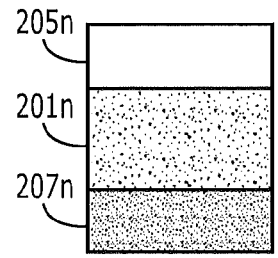
Figure 10A   Figure 10B   Figure 10C
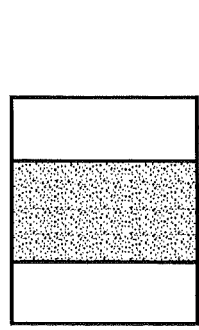 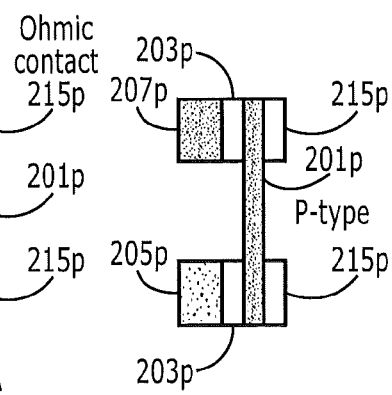 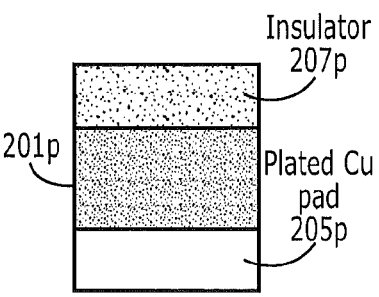
Figure 11A   Figure 11B   Figure 11C

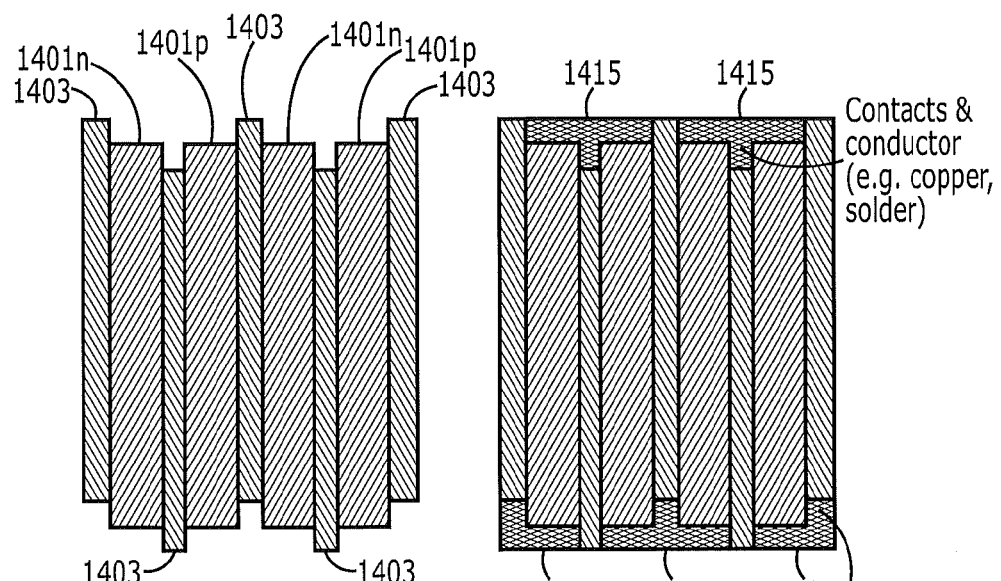
Figure 14D
Figure 14E
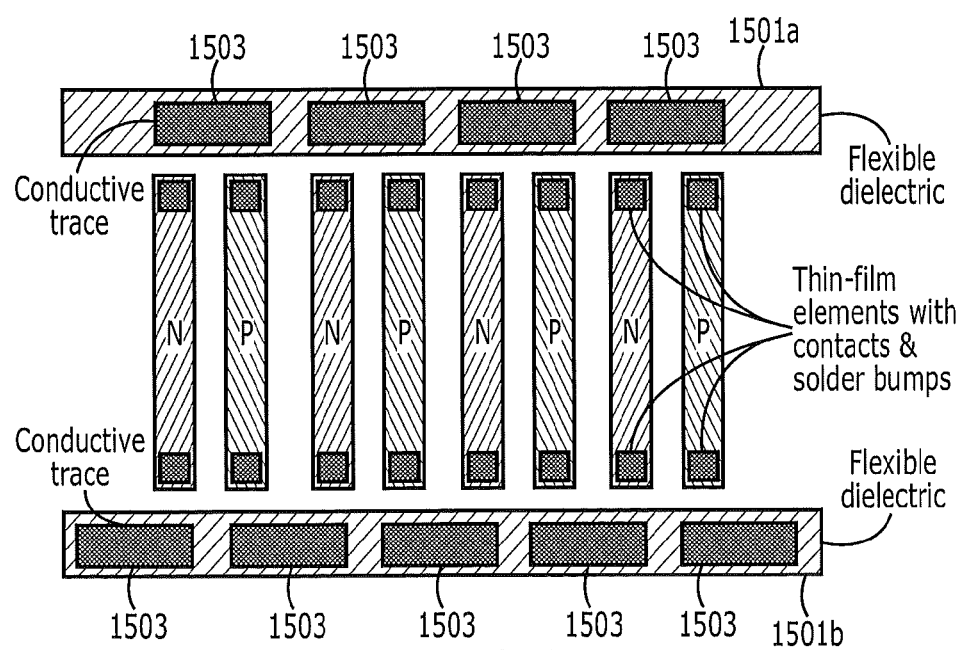
Figure 15A

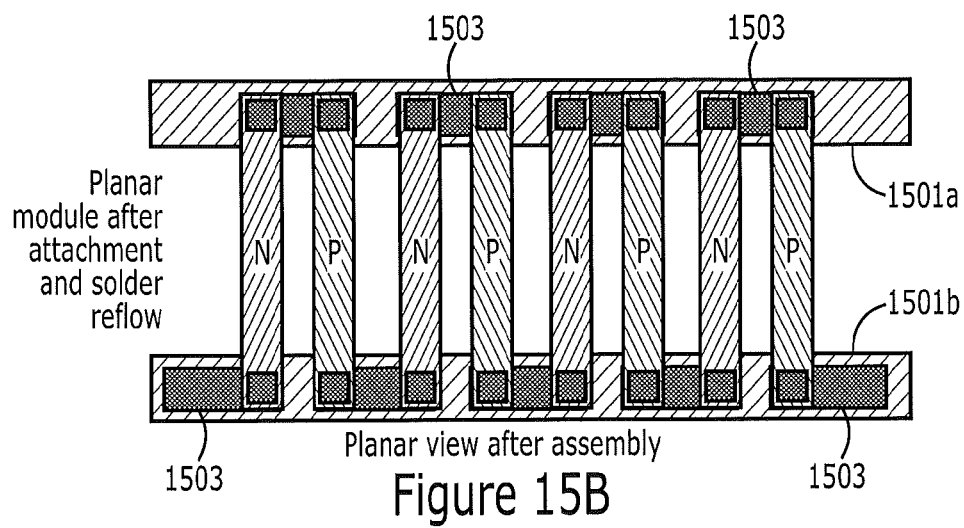
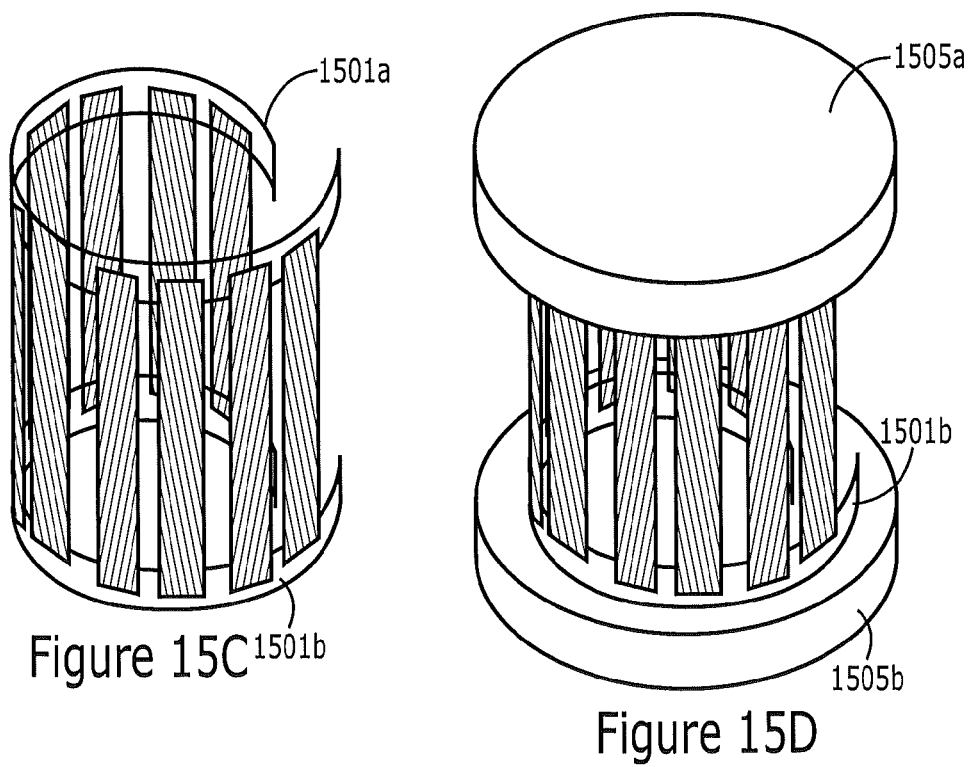

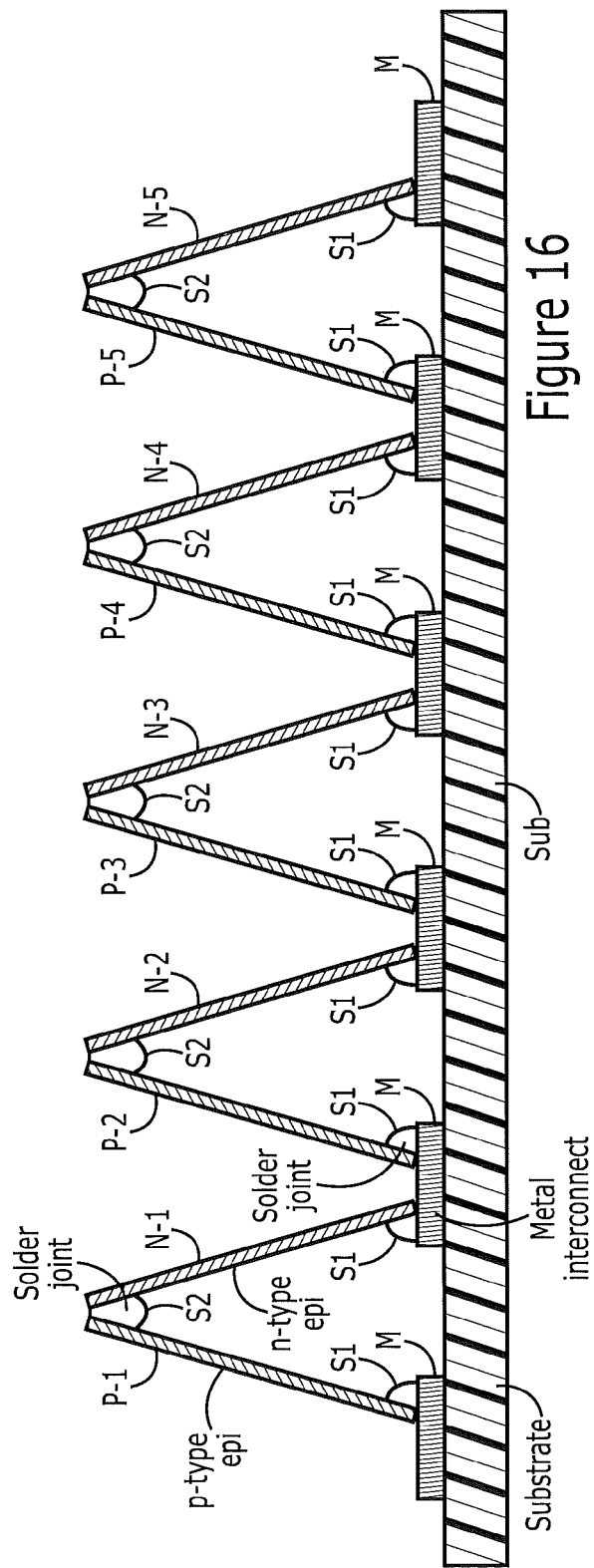

THERMOELECTRIC (TE) DEVICES/STRUCTURES INCLUDING THERMOELECTRIC ELEMENTS WITH EXPOSED MAJOR SURFACES

RELATED APPLICATION

The present application claims the benefit of priority from U.S. Provisional Application No. 61/313,915 entitled "*Thermoelectric Devices Including Stand-Alone Planar Thin-Film P/N Elements*" filed Mar. 15, 2010, the disclosure of which is hereby incorporated herein in its entirety by reference.

FIELD

The present invention relates to the field of electronics, and more particularly, to thermoelectric devices and related structures, methods, and systems.

BACKGROUND

Thermoelectric materials may be used to provide cooling and/or power generation according to the Peltier effect. Thermoelectric materials are discussed, for example, in the reference by Venkatasubramanian et al. entitled "*Phonon-Blocking Electron-Transmitting Structures*" (18$^{th}$ International Conference On Thermoelectrics, 1999), the disclosure of which is hereby incorporated herein in its entirety by reference.

Application of solid state thermoelectric cooling may be expected to improve the performance of electronics and sensors such as, for example, RF receiver front-ends, infrared (IR) imagers, ultra-sensitive magnetic signature sensors, and/or superconducting electronics. Bulk thermoelectric materials typically based on p-$Bi_xSb_{2-x}Te_3$ and n-$Bi_2Te_{3-x}Se_x$ alloys may have figures-of-merit (ZT) and/or coefficients of performance (COP) which result in relatively poor thermoelectric device performance.

The performance of a thermoelectric device may be a function of the figure(s)-of-merit (ZT) of the thermoelectric material(s) used in the device, with the figure-of-merit being given by:

$$ZT=(\alpha^2 T\sigma/K_T),\qquad\text{(equation 1)}$$

where $\alpha$, T, $\sigma$, and $K_T$ are the Seebeck coefficient, absolute temperature, electrical conductivity, and total thermal conductivity, respectively. The material-coefficient Z can be expressed in terms of lattice thermal conductivity ($K_L$), electronic thermal conductivity ($K_e$) and carrier mobility ($\mu$), for a given carrier density ($\rho$) and the corresponding $\alpha$, yielding equation (2) below:

$$Z=\alpha^2\sigma/(K_L+K_e)=\alpha^2/[K_L/(\mu\rho q)+L_0 T)],\qquad\text{(equation 2)}$$

where, $L_0$ is the Lorenz number (approximately $1.5\times 10^{-8} V^2/K^2$ in non-degenerate semiconductors). State-of-the-art thermoelectric devices may use alloys, such as p-$Bi_xSb_{2-x}Te_{3-y}Se_y$ (x≈0.5, y≈0.12) and n-$Bi_2(Se_yTe_{1-y})_3$ (y≈0.05) for the 200 degree K to 400 degree K temperature range. For certain alloys, $K_L$ may be reduced more strongly than $\mu$ leading to enhanced ZT.

A ZT of 0.75 at 300 degree K in p-type $Bi_xSb_{2-x}Te_3$ (x≈1) was reported over forty years ago. See, for example Wright, D. A., Nature vol. 181, pp. 834 (1958). Since then, there has been relatively modest progress in the ZT of thermoelectric materials near 300 degree K (i.e., room temperature). A ZT of about 1.14 at 300 degree K for bulk p-type $(Bi_2Te_3)_{0.25}(Sb_2Te_3)_{0.72}(Sb_2Se_3)_{0.03}$ alloy has been discussed for example, in the reference by Ettenberg et al. entitled "*A New N-Type And Improved P-Type Pseudo-Ternary $(Bi_2Te_3)(Sb_2Te_3)(Sb_2Se_3)$ Alloy For Peltier Cooling,*" (Proc. of 15$^{th}$ Inter. Conf. on Thermoelectrics, IEEE Catalog. No. 96TH8169, pp. 52-56, 1996), the disclosure of which is hereby incorporated herein in its entirety by reference.

SUMMARY

According to some embodiments of the present invention, a thermoelectric structure may include a thermally conductive substrate, and a plurality of thermoelectric elements arranged on a surface of the thermally conductive substrate. Moreover, each thermoelectric element may be non-parallel and non-orthogonal with respect to the surface of the thermally conductive substrate. For example, each of thermoelectric elements may be a planar thermoelectric element, and a plane of each of the thermoelectric elements may be oriented obliquely with respect to the surface of the thermally conductive substrate.

The plurality of thermoelectric elements may include a plurality of p-type and n-type thermoelectric elements, and alternating ones of the p-type and n-type thermoelectric elements may be electrically connected in series. One of the plurality of p-type thermoelectric elements may be adjacent one of the plurality of n-type thermoelectric elements, and the p-type thermoelectric element and the adjacent n-type thermoelectric element may be canted in different directions relative to the surface of the substrate.

Aspect ratios of the thermoelectric elements may be at least about 100 $cm^{-1}$, where an aspect ratio is determined as a length of a thermoelectric element (in the direction of electrical current flow through the thermoelectric element) divided by a cross-sectional area of the thermoelectric element (with the cross-sectional area being normal to the direction of electrical current flow through the thermoelectric element and includes the thickness of the thermoelectric element which is the thinnest dimension normal to the direction of electrical current flow through the thermoelectric element). Thicknesses of the thermoelectric elements may be orthogonal with respect to directions of current flow through the thermoelectric elements. Moreover, each of the planar thermoelectric elements may include first and second opposing surfaces separated by the thickness of the planar thermoelectric element, and both of the first and second opposing surfaces may be exposed to a fluid environment.

A driver circuit may be coupled to the thermoelectric elements, and the driver circuit may be configured to drive an electrical current through the thermoelectric elements to pump heat to/from the thermally conductive substrate. The thermoelectric elements may be thermally coupled to a fluid environment adjacent the thermoelectric elements without a solid heat conducting structure between the thermoelectric elements and the fluid environment so that heat may be pumped through the thermoelectric elements between the thermally conductive substrate and the fluid environment.

A circuit may be coupled to the thermoelectric elements, and the circuit may be configured to receive electrical energy generated by the plurality thermoelectric elements responsive to a temperature gradient across the thermoelectric elements. The thermoelectric elements may be thermally coupled to a fluid environment adjacent the thermoelectric elements without a solid heat conducting structure between the thermoelectric elements and the fluid environment so that electrical energy may be generated by the thermoelectric elements responsive to the temperature gradient between the thermally conductive substrate and the fluid environment.

According to some other embodiments of the present invention, a thermoelectric structure may include a thermally conductive substrate, and a plurality of thermoelectric elements may be arranged on a surface of the thermally conductive substrate. Each of the thermoelectric elements may be non-parallel with respect to the surface of the thermally conductive substrate, and aspect ratios of the thermoelectric elements may be at least about 100 $cm^{-1}$, where an aspect ratio is determined as a length of a thermoelectric (in the direction of electrical current flow through the thermoelectric element) divided by a cross-sectional area of the thermoelectric element (with the cross-sectional area being normal to the direction of electrical current flow through the thermoelectric element and includes the thickness of the thermoelectric element which is the thinnest dimension normal to the direction of electrical current flow through the thermoelectric element). Moreover, each of the planar thermoelectric elements may include first and second opposing surfaces separated by the thickness of the planar thermoelectric element, and both of the first and second opposing surfaces may be exposed to a fluid environment. For example, each of the thermoelectric elements may be non-orthogonal with respect to the surface of the thermally conductive substrate.

Each of thermoelectric elements may be a planar thermoelectric element, and a plane of each of the thermoelectric elements may be oriented obliquely with respect to the surface of the thermally conductive substrate. Moreover, the plurality of thermoelectric elements may include a plurality of p-type and n-type thermoelectric elements, and alternating ones of the p-type and n-type thermoelectric elements may be electrically connected in series. One of the plurality of p-type thermoelectric elements may be adjacent one of the plurality of n-type thermoelectric elements, and the p-type thermoelectric element and the adjacent n-type thermoelectric element may be canted in different directions relative to the surface of the substrate. Cross-sectional areas of the thermoelectric elements may be orthogonal with respect to directions of current flow through the thermoelectric elements.

A driver circuit may be coupled to the thermoelectric elements, and the driver circuit may be configured to drive an electrical current through the thermoelectric elements to pump heat to/from the thermally conductive substrate. The thermoelectric elements may be thermally coupled to a fluid environment adjacent the thermoelectric elements without a solid heat conducting structure between the thermoelectric elements and the fluid environment so that heat may be pumped through the thermoelectric elements between the thermally conductive substrate and the fluid environment.

A circuit may be coupled to the thermoelectric elements, and the circuit may be configured to receive electrical energy generated by the plurality thermoelectric elements responsive to a temperature gradient across the thermoelectric elements. The thermoelectric elements may be thermally coupled to a fluid environment adjacent the thermoelectric elements without a solid heat conducting structure between the thermoelectric elements and the fluid environment so that electrical energy may be generated by the thermoelectric elements responsive to the temperature gradient between the thermally conductive substrate and the fluid environment.

BRIEF DESCRIPTION OF THE DRAWINGS

FIGS. 9A, 9B, and 9C are respective back, side, and front views of an in-plane thermoelectric element formed as discussed above with respect to FIGS. 1-8;

FIGS. 10A, 10B, and 10C are respective back, side, and front views of an in-plane n-type thermoelectric element formed as discussed above with respect to FIGS. 1-8, 9A, 9B, and 9C;

FIGS. 11A, 11B, and 11C are respective back, side, and front views of an in-plane p-type thermoelectric element formed as discussed above with respect to FIGS. 1-8, 9A, 9B, and 9C;

FIGS. 14C and 14D are a cross-sectional views illustrating folding of the flexible dielectric sheet of FIGS. 14A and 14B;

FIG. 14E is a cross-sectional view illustrating formation of electrical interconnections between thermoelectric elements of the structure of FIG. 14D to provide in-plane current and thermal flow;

FIGS. 15A to 15D are plan views illustrating operations of forming thermoelectric modules using flexible dielectric strips according to some embodiments of the present invention;

FIGS. 16 to 20 are cross-sectional views illustrating thermoelectric structures/devices providing in-plane current and thermal flow according to some embodiments of the present invention.

DETAILED DESCRIPTION

The present invention is described herein with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Thermoelectric applications, whether for cooling or power generation, may require that a thermoelectric module is sized to match the electrical and thermal characteristics of the system in which it is to be included. Standard bulk and cross-plane thin-film thermoelectric devices may have moderately low element aspect ratios (length/area) in the range of 1 $cm^{-1}$ to 50 $cm^{-1}$. These devices may be best suited for applications requiring a lower module thermal resistance and higher heat-pumping capacity. Other applications may require element aspect ratios (length/area) at least two orders of magnitude higher, in the range of 100 $cm^{-1}$ to 5000 $cm^{-1}$.

Figure 21B:
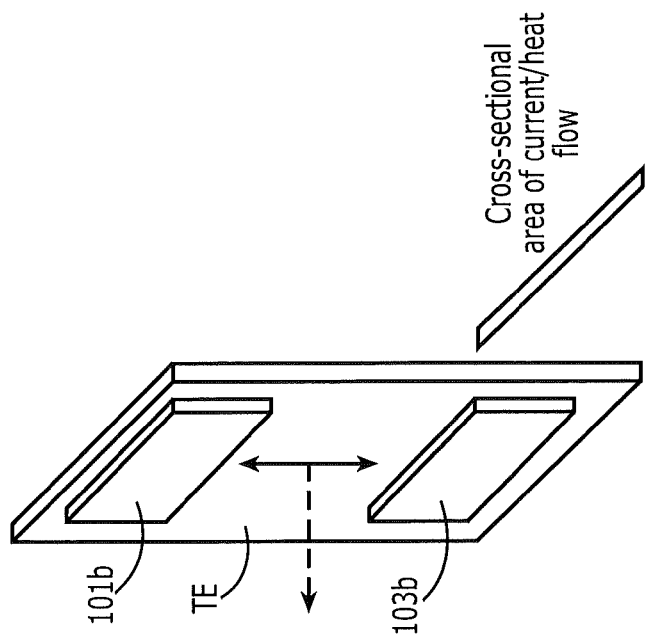
FIGS. 21A and 21B are plan views of thermoelectric elements respectively providing cross-plane and in-plane current and thermal flow according to some embodiments of the present invention.

These applications may include milli-watt level and smaller power generation for battery charging and remote sensor powering and also low power heat-pumping. Aspect ratios over 100 cm$^{-1}$ may be difficult to achieve in both bulk and cross-plane thin-film technologies due to the extent that the cross-sectional area would need to be reduced for normal thicknesses. Rotating a thin-film element 90 degrees may address this problem by placing the naturally small dimension in the cross-sectional area instead of in the thickness direction, as discussed below with respect to FIGS. 21A and 21B. As used herein, an aspect ratio may be determined as a length of a thermoelectric element (in the direction of electrical current flow through the thermoelectric element) divided by a cross-sectional area of the thermoelectric element (with the cross-sectional area being normal to the direction of electrical current flow through the thermoelectric element and includes the thickness of the thermoelectric element which is the thinnest dimension normal to the direction of electrical current flow through the thermoelectric element). Thicknesses of the thermoelectric elements may be orthogonal with respect to directions of current flow through the thermoelectric elements.

Figure 21A:
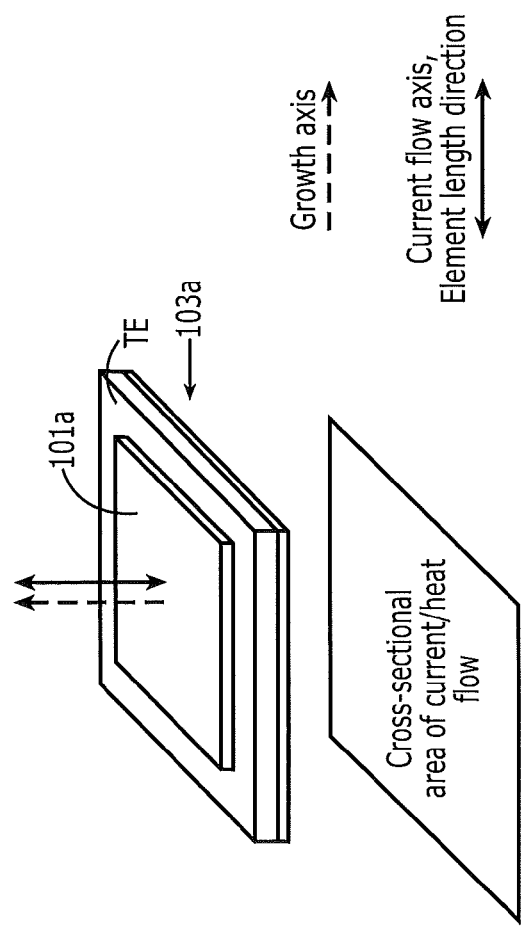

As shown in FIG. 21A, a thin-film epitaxial thermoelectric (TE) element may conduct current along a current flow axis (between first and second metal contacts illustrated by solid line/arrow) between metal contacts 101a and 103a in a same direction as a growth axis (illustrated by dotted line/arrow) of the TE element. The TE element of FIG. 21A may be referred to as a cross-plane TE element with a relatively large cross-sectional area of current/heat flow defined by an area of a major surface of the TE element. According to some embodiments of the present invention shown in FIG. 21B, a thin-film epitaxial thermoelectric (TE) element may conduct current along a current flow axis (between first and second metal contacts 101b and 103b) that is perpendicular with respect to a growth axis of the TE element. The TE element of FIG. 21B may be referred to as an in-plane TE element. Accordingly, a cross-sectional area of current/heat flow through the TE element may be significantly reduced according to some embodiments of the present invention. In other words, a cross-sectional area of current/heat flow may be defined by a thickness of the TE element (in the direction of the growth plane) and a width of the thermoelectric element TE, while a length of current/heat flow is determined (at least in part) by a length of the thermoelectric element TE.

Figure 1:
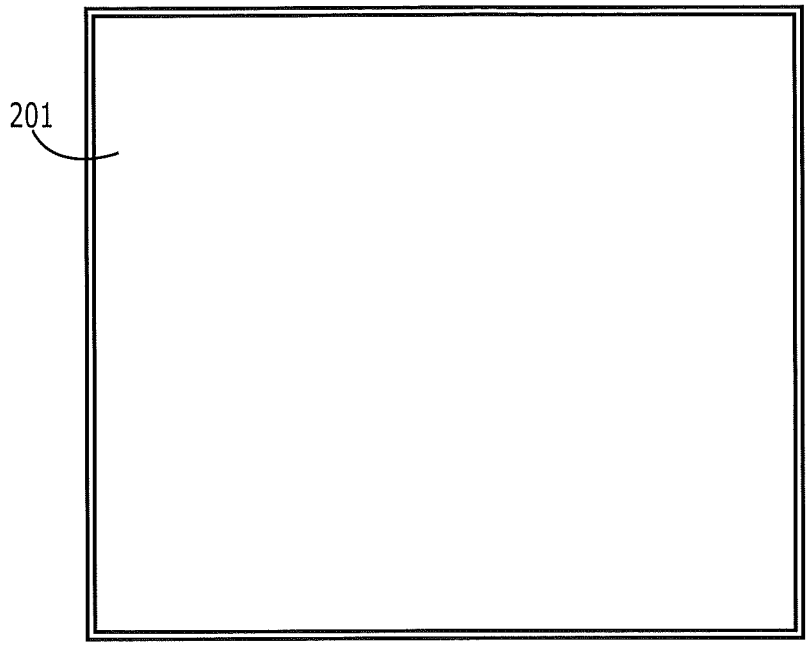
FIGS. 1-8 are plan views illustrating operations of forming in-plane thermoelectric elements according to some embodiments of the present invention.
Figure 2:
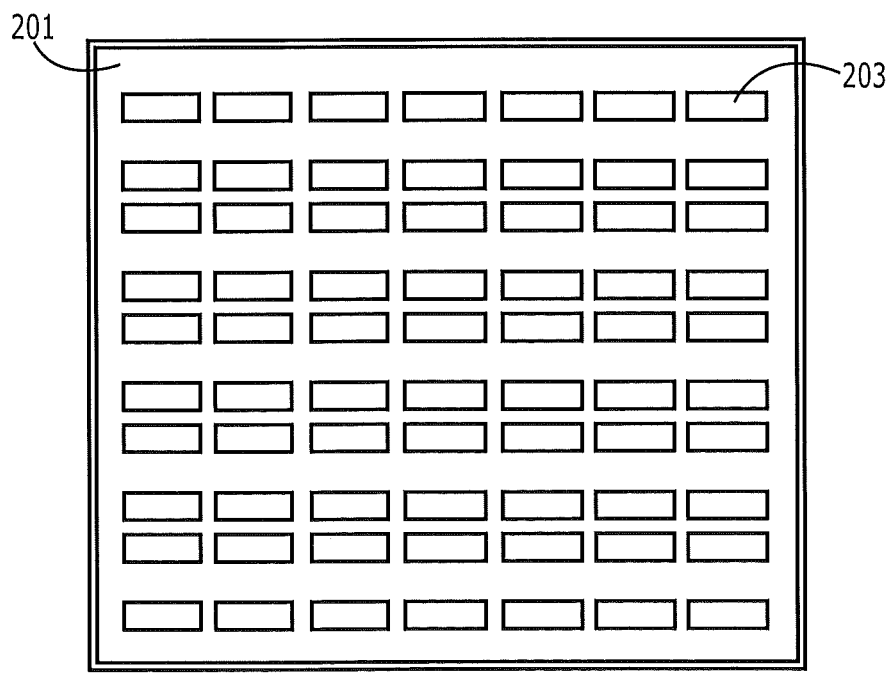

Operations of forming in-plane TE elements and assembling the in-plane TE elements into thermoelectric structures/devices according to some embodiments of the present invention are illustrated in FIGS. 1-8, 9A-C, 10A-C, 11A-C, 12A-B, and 13. As shown in the plan view of FIG. 1, a thin epitaxial layer of thermoelectric material (e.g., Bi$_2$Te$_3$) 201 of a first conductivity type (either p-type or n-type) is formed on a single crystal growth substrate (e.g., GaAs). As shown in FIG. 2, a pattern of ohmic contacts (e.g., Cr/Ti/Ni/Au or chromium/titanium/nickel/gold) 203 is formed on the thermoelectric material 201, for example, using a lift-off or shadow mask.

Figure 3:
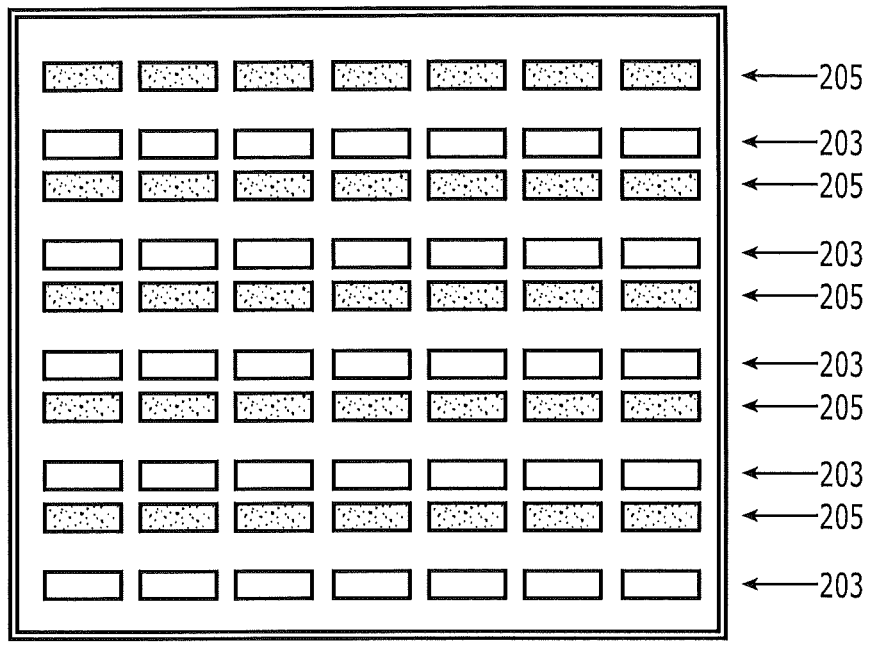
Figure 4:
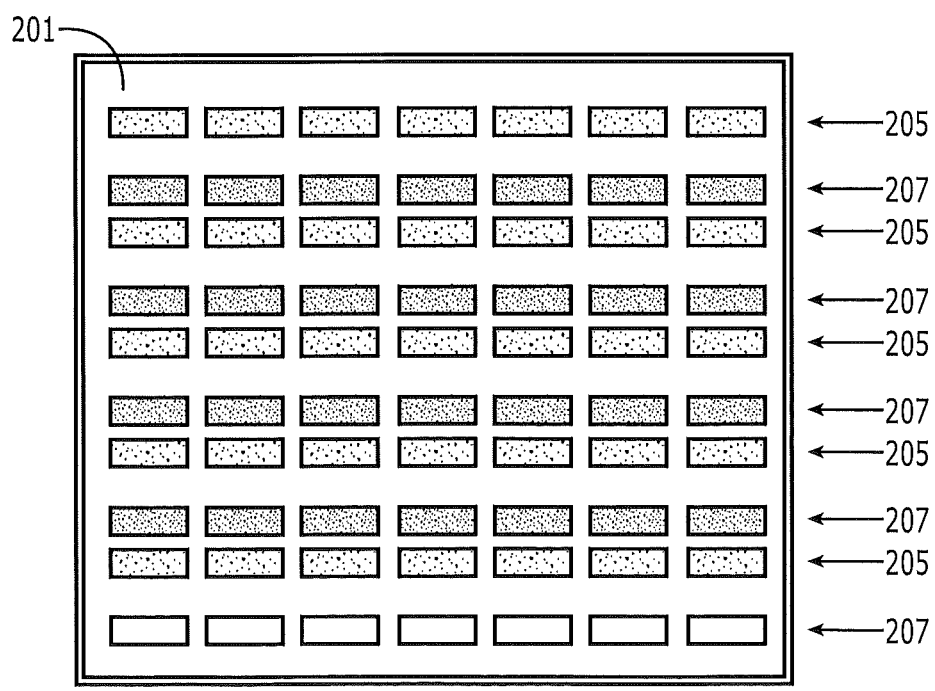

As shown in FIG. 3, conductive pads 205 are formed on alternate rows of the ohmic contacts 203, for example, by plating through a plating template. Each pad 205 may include a Cu (copper) layer on the respective ohmic contact 203, and an Sn (tin) cap on the Cu (copper) layer. Moreover, each pad 205 may have a thickness of about 25 μm micrometers. As shown in FIG. 4, insulating coupons 207 (e.g., polyimide coupons) are formed on the exposed ohmic contacts 203 (i.e., ohmic contacts 203 not covered by conductive pads 205). Insulating coupons 207, for example, may be polyimide coupons having thicknesses of about 25 μm micrometers. Accordingly, conductive pads 205 and insulating coupons 207 may have approximately equal/matched thicknesses.

Figure 5:
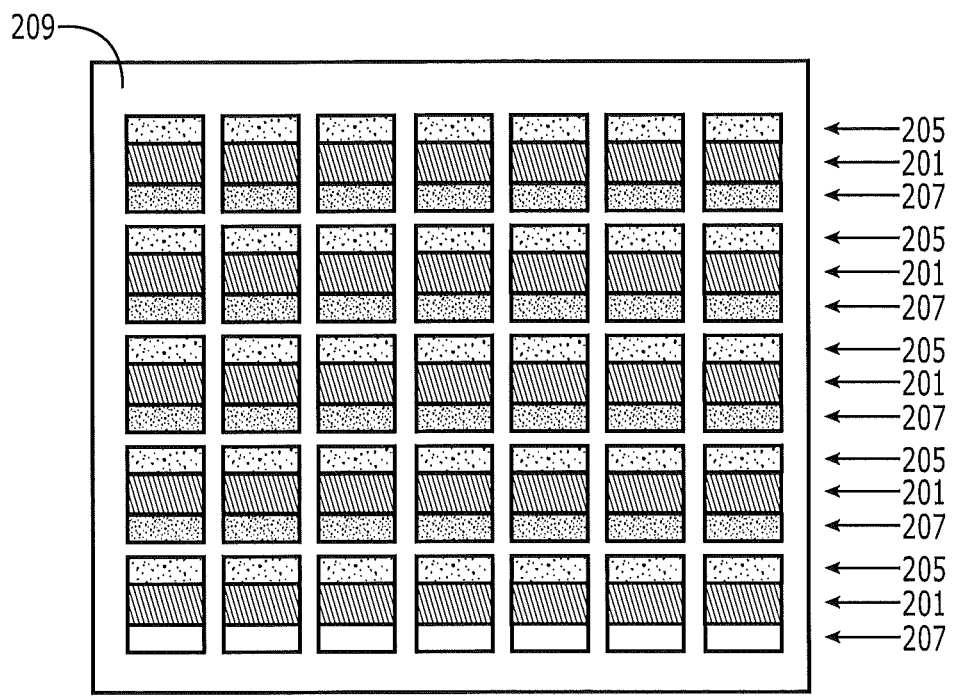

As shown in FIG. 5, conductive pads 205, insulating coupons 207, and portions of thermoelectric material 201 therebetween may be protected (e.g., using a photoresist etch mask), and exposed portions of thermoelectric material 201 may be etched to expose portions of growth substrate 209 thereby providing the structure of FIG. 5. In particular, a plurality of islands of thermoelectric material 201 may remain on growth substrate 209, and each thermoelectric island may include a conductive pad 205 and an insulating coupon 207 thereon at opposite ends thereof.

Figure 6:
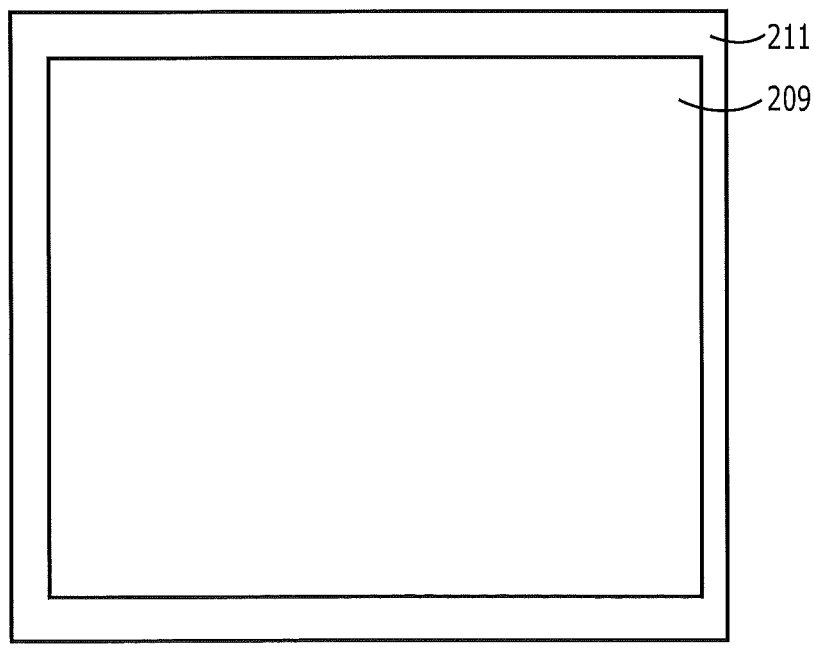

As shown in FIG. 6, the growth substrate of FIG. 5 may be flipped over and secured to secondary carrier 211, for example, using wax. In FIG. 6, a backside of growth substrate 209 is shown, and islands of thermoelectric material 201 are between growth substrate 209 and secondary carrier 211. Accordingly, islands of thermoelectric material 201 are not visible in FIG. 6.

Figure 7:
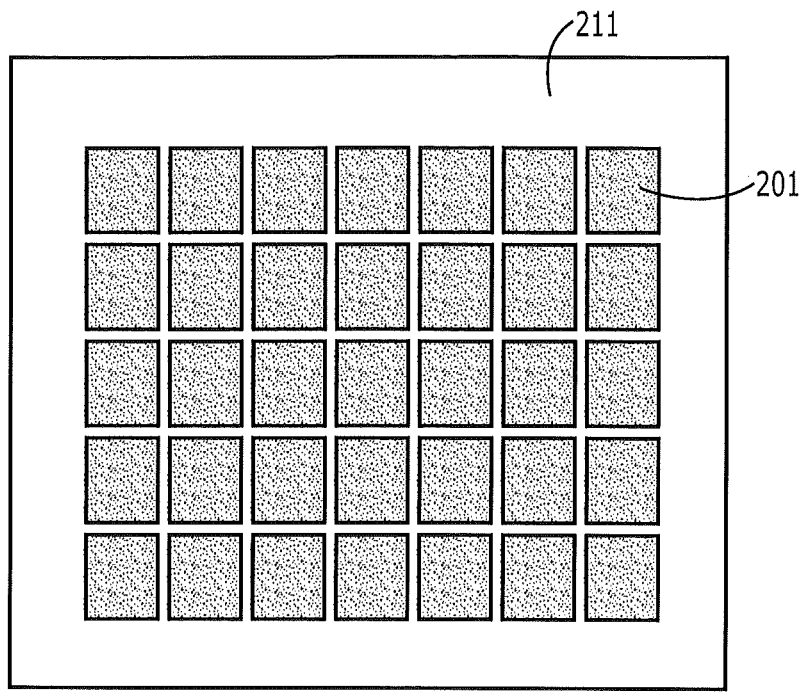

As shown in FIG. 7, growth substrate 209 may be selectively removed to expose the epitaxial islands of thermoelectric material 201 on secondary carrier 211. While not visible in the plan view of FIG. 7, ohmic contacts 203, conductive pads 205, and insulating coupons 207 are between epitaxial islands of thermoelectric material 201 and secondary carrier 211. While not discussed above, an epitaxial buffer layer may be formed between growth substrate 209 and epitaxial layer of thermoelectric material 201 before forming the epitaxial layer of thermoelectric material. Such a buffer layer may be removed to expose the thermoelectric material of the islands of FIG. 7, for example, using a Br$_2$/Methanol etchant.

Figure 8:
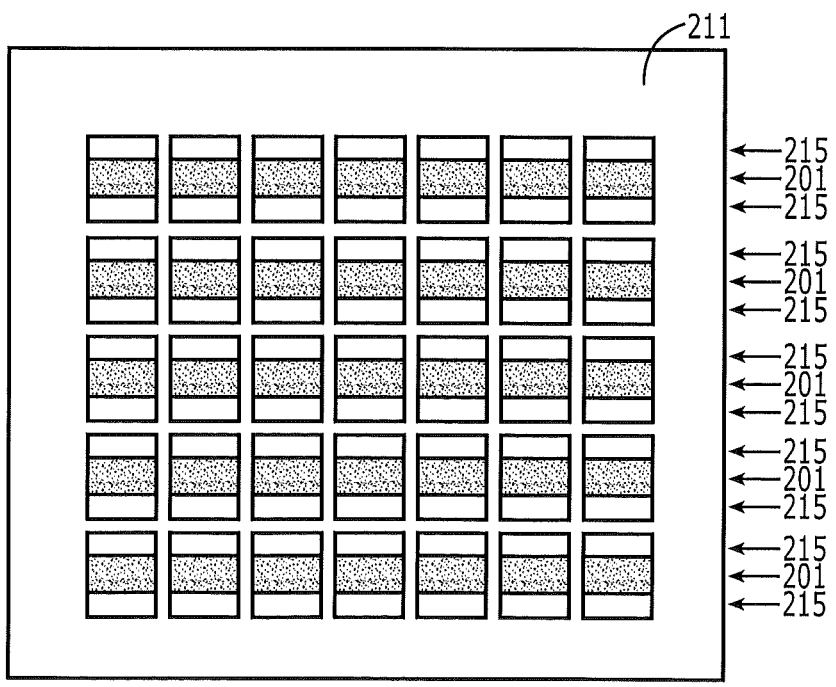

As shown in FIG. 8, ohmic contacts (e.g., Cr/Ti/Ni/Au) 215 may be formed on exposed surfaces of epitaxial islands of thermoelectric material 201. More particularly, two ohmic contacts 215 may be formed on each island with ohmic contacts 215 at opposite ends of each island of thermoelectric material 201.

The islands of thermoelectric material 201 may be released from carrier 211 using an appropriate solvent to remove the wax (and/or other material such as photoresist) used to secure the islands to carrier 211 thereby providing a plurality of thermoelectric elements 201' of the same conductivity type. In the example illustrated above, thirty five thermoelectric elements may be provided, with each thermoelectric element having the structure illustrated in the respective back, side, and front views of FIGS. 9A, 9B, and 9C. As shown in FIGS. 9A and 9B, a backside of each thermoelectric element 201' may include ohmic contacts 215 at opposite ends thereof. As shown in FIGS. 9B and 9C, a front side of each thermoelectric element 201' may include a conductive pad 205 at one end and an insulating coupon 207 at the other end. Moreover, ohmic contacts 203 may be included between conductive pad 205 and the front side of thermoelectric material 201 and between insulating coupon 207 and the front side of thermoelectric material 201 as shown in FIG. 9B.

Operations of FIGS. 1-9 may be performed for an N-type epitaxial thermoelectric layer 201n to provide a plurality of N-type thermoelectric elements as shown in the back, side, and front views of FIGS. 10A, 10B, and 10C. Each N-type thermoelectric element may thus include epitaxial islands of N-type thermoelectric material 201n, ohmic contacts 203n, conductive pads 205n, insulating coupons 207n, and ohmic contacts 215n. Operations of FIGS. 1-9 may be separately performed for an P-type epitaxial thermoelectric layer 201p to provide a plurality of P-type thermoelectric elements as shown in the back, side, and front views of FIGS. 11A, 11B, and 11C. Each P-type thermoelectric element may thus include epitaxial islands of P-type thermoelectric material 201p, ohmic contacts 203p, conductive pads 205p, insulating coupons 207p, and ohmic contacts 215p.

Figure 12A:
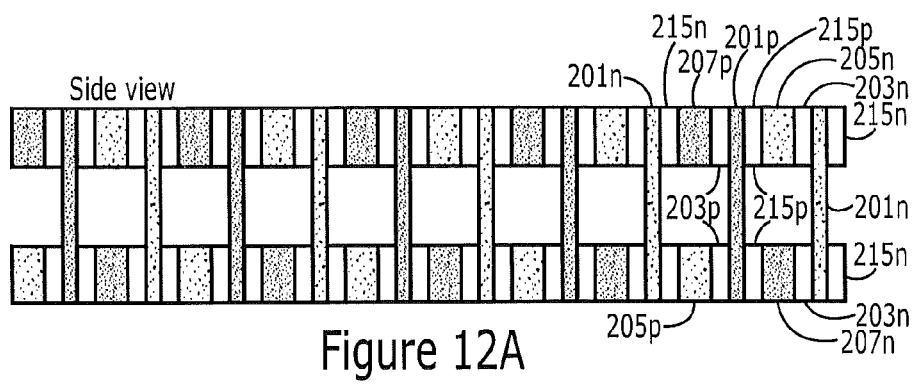
FIGS. 12A and 12B are respective side and top views of a thermoelectric structure formed using in-plane n-type and p-type thermoelectric elements as discussed above with respect to FIGS. 11A, 11B, and 11C.
Figure 12B:
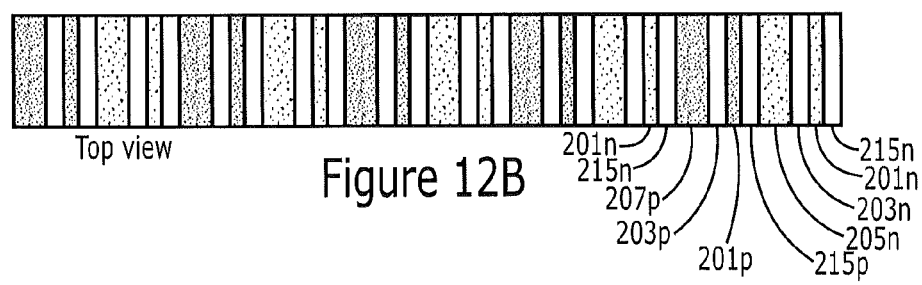

Pluralities of N-type and P-type thermoelectric elements may be alternatingly bonded (e.g., soldered) as shown in the side and top views of FIGS. 12A and 12B. In the example of FIGS. 12A and 12B, N-type thermoelectric elements may be oriented with insulating coupons 207n down and to the left, and P-type thermoelectric elements may be oriented with insulating coupons 207p oriented up and to the left. By way of example, tin (Sn) solder may be provided on ohmic contacts 215n and 215p and/or tin (Sn) solder may be provided on insulating coupons 207n/207p and conductive pads 205n/205p. A single solder reflow operation may thus be performed to bond all of the thermoelectric elements of the assembly.

Figure 13:
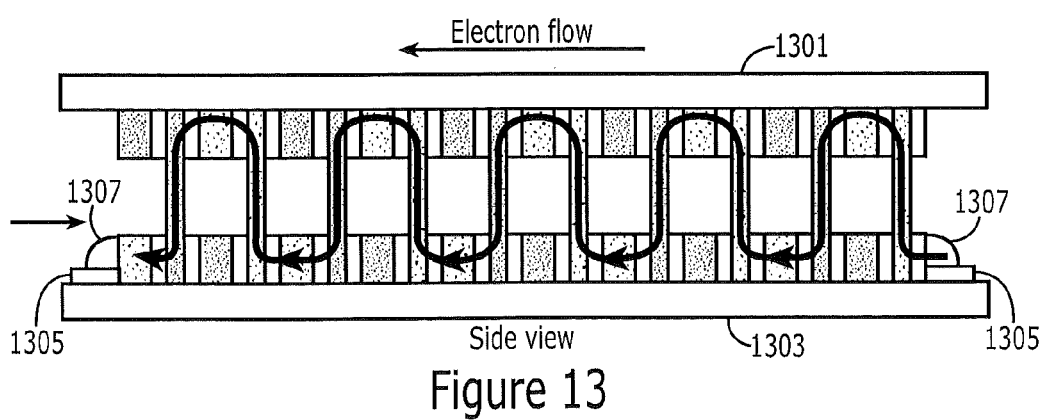
FIG. 13 is a side view of a thermoelectric device including the thermoelectric structure of FIGS. 12A and 12B.

The assembly of thermoelectric elements may then be bonded to thermally conductive (e.g., ceramic) substrates (or headers) 1301 and 1303 (e.g., using a high thermal conductivity epoxy) as shown in FIG. 13. The arrows of FIG. 13 show a path of electrical current flow between traces (e.g., copper traces) 1305 on substrate 1303. More particularly, first and last elements of the thermoelectric assembly may be soldered to traces 1305 using solder 1307. Solder 1307 may be a solder such as an InSn solder having a relatively low melting temperature so that solder 1307 melts at a lower temperature than a solder (e.g., Sn) used to bond the thermoelectric elements. Accordingly, electrical/mechanical coupling to traces 1305 using solder 1307 may be provided without reflowing solder used to bond the thermoelectric elements. As shown in FIG. 13, electrical contacts of each thermoelectric element may be offset on opposite sides of the thermoelectric element. Accordingly, a path of current through the thermoelectric material may be perpendicular with respect to a direction of growth of the thermoelectric material. Stated in other words, a current path through thermoelectric elements may be parallel with respect to a plane of the thermoelectric elements.

A module as discussed above with respect to FIG. 13 may be provided for different applications with any number of couples/pairs of P-type and N-type in-plane thermoelectric elements and the thermoelectric material of the elements may be provided with different lengths/widths/thicknesses determined according to heat and/or electrical power of the application.

As discussed above, p-type and n-type epitaxial coupons (also referred to as thermoelectric elements or TE elements) may be fabricated to provide separate elements before placement/assembly into a completed module. Having in-plane TE elements made in this fashion may allow process and/or design improvements. First, the stand-alone elements can be bonded on both sides at the same time, reducing/eliminating the need for a second bonding step which may remove an addition thermal cycle. Second, the use of only one solder may provide a TEC with higher temperature compatibility. Third, because the elements are made first and placed into modules in a second operation, it may be possible to screen the elements for ZT and/or aesthetics prior to assembly. Module yields may thus increase if known good elements are used for module production.

In a thin-film thermoelectric module providing heat and current flow in a direction normal to the plane of the thin-film thermoelectric elements, an electrical/thermal length of the thermoelectric element may be defined by a thickness of the thermoelectric film(s) used to build the modules. Defining an electrical/thermal length by the thickness of the thermoelectric material, however, may negatively impact performance and/or efficiency of cooling and/or power generation modules so formed.

Alternate thermoelectric structures may provide thermoelectric modules where heat and current flow occur partially or completely in the plane of the thin-film thermoelectric material (or wafer). According to some embodiments of the present invention described herein, thermoelectric modules may be fabricated with heat and current flow provided in the plane of the thin-film thermoelectric material. Moreover, these thermoelectric modules may be provided with structural rigidity and increased thermal efficiency. Embodiments of the present invention discussed above with respect to FIGS. 1-13, for example, may provide current flow and heat transfer in a direction of a plane of the thermoelectric material, and the structure of FIGS. 12A-B and 13 may provide structural rigidity and increased thermal efficiency. Additional methods/structures for thermoelectric modules with laterally offset contacts on epitaxial thermoelectric material are discussed in U.S. Provisional Application No. 61/211,721 filed Apr. 2, 2009, and in U.S. Publication No. 2010/0252087 published Oct. 7, 2010, the disclosures of which are hereby incorporated herein in their entireties by reference. Methods/structures according to additional embodiments of the present invention may provide increased structural rigidity.

Figure 14A:
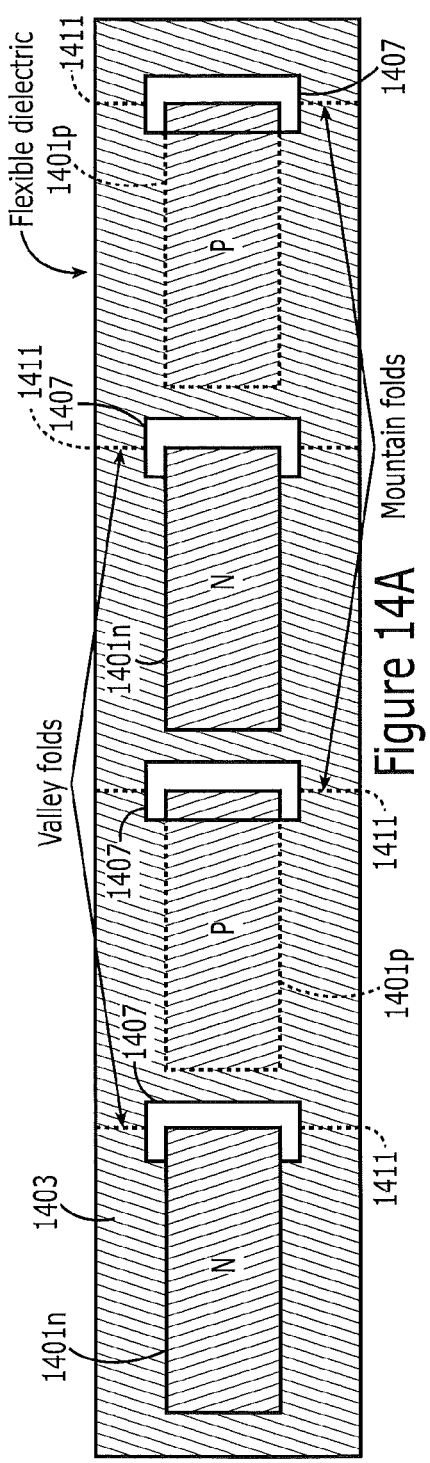
FIGS. 14A and 14B are respective plan and cross-sectional views illustrating alternating n-type and p-type thermoelectric elements on a flexible dielectric sheet according to some embodiments of the present invention.
Figure 14B:
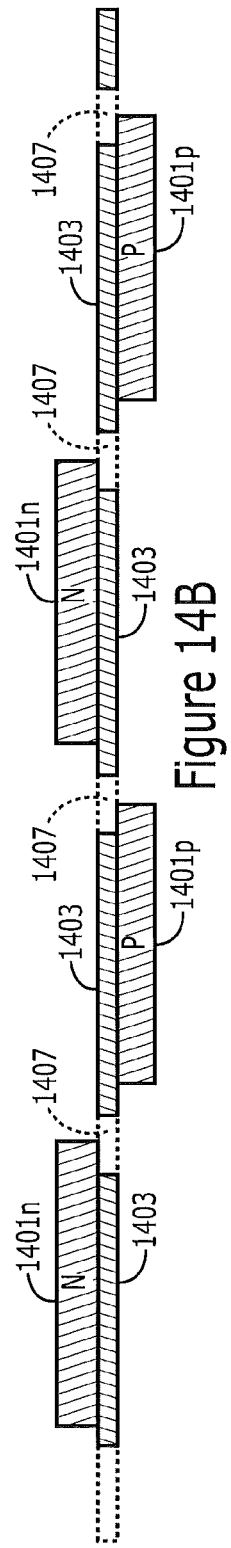

As shown in the plan and cross-sectional views of FIGS. 14A and 14B, a plurality of N-type and P-type epitaxial thin-film thermoelectric elements 1401n and 1401p may be alternatingly arranged on opposite sides of a flexible dielectric layer 1403. The dielectric layer 1403 may be a thin and flexible dielectric material (such as polyimide, kapton, etc.) having a relatively low thermal conductivity with respective cut-outs 1407 at ends of each thermoelectric element. Moreover, the thermoelectric elements 1401n and 1401p may be deposited on flexible dielectric layer 1403, or thermoelectric elements 1401n and 1401p may be separately formed and then assembled onto the flexible dielectric layer 1403. While not shown in FIG. 14A or 14B, a plurality of dielectric layers 1403 (including cut outs 1407) may be cut/stamped out of a larger sheet of the flexible dielectric material.

Figure 14C:
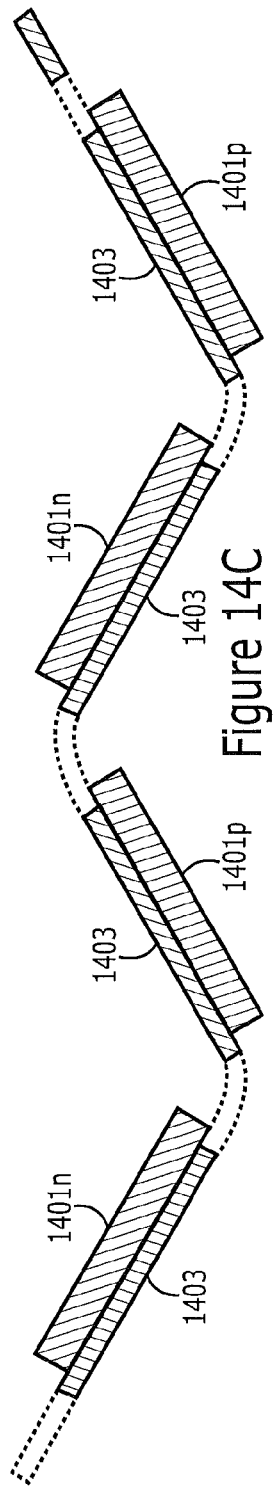

As shown in FIG. 14C, flexible dielectric layer 1403 may be folded along fold lines 1411 accordion style (either individually or together) to provide the final folded structure of FIG. 14D. Cut-outs 1407 provide exposure of edges of thermoelectric elements 1401n and 1401p as shown in FIG. 14C to provide electrical coupling therebetween. Moreover, edges of flexible dielectric layer 1403 may be used to hold multiple thermoelectric modules together. As shown in FIG. 14E, edges of adjacent N-type and P-type thermoelectric elements 1401n and 1401p may be electrically coupled using metal contacts 1415. For example, copper metallization may provide metal contacts 1415, and metal contacts 1415 may be covered with a thin layer of a bonding metal (e.g., solder) applied as a conductive paste and/or applied by electroplating. Providing that flexible dielectric layer 1403 protrudes/recesses selectively (as shown in FIGS. 14D and 14E) helps ensure the desired electrical connections of FIG. 14E. Each end of a thermoelectric element is electrically connected to no more than one adjacent thermoelectric element of opposite conductivity. Accordingly, thermoelectric elements 1401 of alternating conductivity type are electrically connected in series, with a direction of current flow through N-type thermoelectric elements 1401n being opposite a direction of current flow through P-type thermoelectric elements 1401p. After forming metal contacts 1415, excess dielectric material may be trimmed off.

According to additional embodiments of the present invention illustrated in FIGS. 15A, 15B, and 15C, conductive traces 1503 may be provided on flexible dielectric strips 1501a and 1501b, n-type and p-type thermoelectric elements N and P may be bonded to the conductive traces 1503 (e.g., using solder), and flexible dielectric strips 1501a and 1501b may be rolled and/or folded into a relatively compact structure. As shown in FIG. 15A, for example, flexible dielectric strips 1501a and 1501b may be provided with conductive traces 1503 thereon, and flexible dielectric strips may be strips of a material such as polyimide, kapton, etc. While separate strips 1501a and 1501b are shown by way of example, strips 1501a and 1501b may be portions of a patterned sheet with holes therein (corresponding to positions of central portions of thermoelectric elements) to provide improved thermal efficiency. As shown in FIG. 15A, ohmic contact and solder structures may be provided at ends of N-type and P-type thermoelectric elements N and P. In addition or in an alternative, solder may be provided on conductive traces 1503.

As shown in FIG. 15B, thermoelectric elements N and P may be bonded to conductive traces 1503 on flexible dielectric strips 1501a and 1501b, for example, to provide a ladder structure. Accordingly, a series electrical path is defined through alternating N-type and P-type thermoelectric elements N and P with a direction of current flow through N-type thermoelectric elements being opposite a direction of current flow through P-type thermoelectric elements.

Flexible dielectric strips 1501a and 1501b may be rolled or folded into a more compact structure as shown in FIG. 15C. As shown in FIG. 15D, thermally conductive end caps 1505a and 1505b may be attached to top and/or bottom ends of the module (including the rolled strips 1501a and 1501b and thermoelements N and P) using a thermally conductive epoxy and/or paste.

According to some embodiments of the present invention, interconnection between thermoelectric elements may be provided using a flexible medium such as polyimide or kapton (like a flexible printed wiring board). The flexible dielectric may be chosen to have a relatively low thermal conductivity (polyimide, kapton, BCB etc.) and may be thin (e.g., in the range of about 1 micrometer to about 50 micrometers) to reduce impact on thermal efficiency of the module. Conductive wire traces in/on a flex tape may permit the thermoelectric elements to be connected electrically to form couples and create a module. The flex tape can be provided as a single continuous piece, as a single piece with cut-out regions (for higher thermal efficiency), or as two individual tapes/strips. A structural rigidity of the module may be improved by folding or rolling the planar module assembly into a prismatic block or into a prismatic or spiral cylinder as shown in 15C. Thermally conductive end caps 1505a and 1505b can be attached to opposite ends of the module to interface with heat source and/or heat sink as in FIG. 15D. Multiple tapes can be used to create multistage cascade thermoelectric modules with similar or dissimilar types and numbers of elements in each stage. A completed module assembly can also be coated with a thin conformal coating of parylene to provide a barrier to moisture and gases and improve its reliability.

Thermoelectric devices (whether used for cooling/heat-pumping or for power generation) may benefit from efficient heat-exchangers to operate more effectively. A heat-exchanger(s) may serve to reject heat delivered by the TE (thermoelectric) device to a cooler ambient or to absorb heat from a warmer ambient. The heat-exchanger may be a separate, purpose-built unit, attached to the TE device using a thermal interface material. This structure may add thermal resistance between the TE material and air and may also add significant mass to the second side of the TE device increasing susceptibility to failure from mechanical vibration, shock, and/or CTE (coefficient of thermal expansion) stress.

According to some embodiments of the present invention, TE devices may be implemented that include one less external heat-exchanger by building the heat-exchanger into the structure of the TE device. For example, each TE element couple may act as a heat-exchanger fin. With a cooler ambient, each couple may reject its own heat to ambient directly. With a warmer ambient, each couple may absorb heat from the ambient directly. This effect may work for both cooling/heat-pumping and power generation modes. Eliminating the external heat-exchanger may provide a smaller TE device with potentially higher reliability and/or efficiency.

Operation of a TE device without a purpose-built heat-exchanger may be improved by increasing TE element thermal resistance and surface area. Heat-flux rejected or absorbed by natural convection and/or IR radiation near room temperature may be relatively low so that increased thermal resistance of the TE element may provide better thermal matching. Accordingly, an aspect ratio of the TE element may be increased. Additionally, net power that can be exchanged may be limited by an available surface area of the element. In general, structures with large aspect ratios and surface area may provide improved operation.

Bulk TE elements may offer a relatively large surface area for heat exchange but may have a relatively low aspect ratio. Micro-bulk and cross-plane thin-film TE elements may be less favorable due to a lower surface area for a comparable aspect ratio. In-plane epitaxial thin-film TE elements may provide surface areas comparable to traditional bulk elements while providing aspect ratios two orders of magnitude higher. According to embodiments of the present invention, planar epitaxial thin-film TE elements may be used to provide direct heat-exchange structures.

As shown in the cross-sectional view of FIG. 16, a plurality of N-type and P-type epitaxial thin-film thermoelectric elements N-1 to N-5 and P-1 to P-5 may be mounted on a thermally conductive substrate Sub (also referred to as a thermally conductive header). More particularly, thermoelectric elements N-1 to N-5 and P-1 to P-5 may be bonded to metal interconnections M (e.g., electrically conductive traces such as copper traces) using solder joints S1, and adjacent thermoelectric elements of a P-N couple/pair (e.g., P-1 and N-1, P-2 and N-2, etc.) may be electrically and mechanically coupled using solder joints S2. While a linear arrangement of thermoelectric elements P and N on substrate Sub is shown, any arrangement (e.g., linear, array, spiral, serpentine, and/or combinations thereof) may be provided on substrate Sub.

The thermoelectric structure of FIG. 16 may thus include a plurality of thermoelectric elements P and N arranged on a surface of thermally conductive substrate Sub (or header), with each of the thermoelectric elements being non-parallel with respect to the surface of the thermally conductive substrate Sub. Moreover, aspect ratios of the thermoelectric elements may be at least about 100 cm$^{-1}$. By canting thermoelectric elements P and N at angles relative to substrate Sub, both major surfaces of each thermoelectric element (i.e., opposing surfaces of the thermoelectric element separated by a thickness of the thermoelectric element) may be exposed to a fluid/ambient environment (e.g., air, water, etc.) to facilitate heat transfer directly between major surfaces of the thermoelectric elements and the fluid/ambient environment. By providing this increased exposure between thermoelectric elements and a surrounding fluid environment, a second substrate/header may be omitted with the thermoelectric elements P and N pumping heat between the fluid/ambient environment and the substrate Sub, and/or with the thermoelectric elements P and N generating an electrical signal responsive to a temperature gradient between the fluid/ambient environment and the substrate Sub. Stated in other words, heat transfer between thermoelectric elements P and N may occur primarily through direct heat transfer between the fluid/ambient environment and major surfaces of thermoelectric elements P and N.

As further shown in FIG. 16, the plurality of thermoelectric elements P and N may be arranged on the surface of thermally conductive substrate Sub (or header), with each thermoelectric element being non-parallel and non-orthogonal with respect to the surface of the thermally conductive substrate Sub. More particularly, each thermoelectric element P or N may be a planar thermoelectric element with a plane of the thermoelectric element being oriented obliquely with respect to the surface of the thermally conductive substrate Sub.

As further shown in FIG. 16, the p-type thermoelectric elements P-1 to P-5 may be canted in a first direction relative to the surface of substrate Sub, the n-type thermoelectric elements N-1 to N-5 may be canted in a second direction relative to the surface of substrate Sub. Accordingly, a pair of adjacent p-type and n-type thermoelectric elements (e.g., thermoelectric elements P-1 and N-1) may define a P-N couple, and the p-type and n-type thermoelectric elements of the couple may be canted in different directions relative to the surface of substrate Sub. The resulting triangular structure defined by the p-type and n-type thermoelectric elements of the couple and substrate Sub may provide stability for the free-standing couple where a second substrate or header is omitted.

Moreover, cross-sectional areas of thermoelectric elements P and N are orthogonal with respect to directions of current flow through the thermoelectric elements P and N. By providing a relatively long narrow path for current and heat flow through each of the thermoelectric elements and by providing relatively large surface areas of the thermoelectric elements exposed to the fluid/ambient environment, thermal resistances through the thermoelectric elements may be more closely matched with thermal resistances between the thermoelectric elements and the adjacent fluid environment, and/or one or both electrical resistances through the thermoelectric elements may be more closely matched with thermal resistances between the thermoelectric elements and the adjacent fluid environment.

Figure 17:
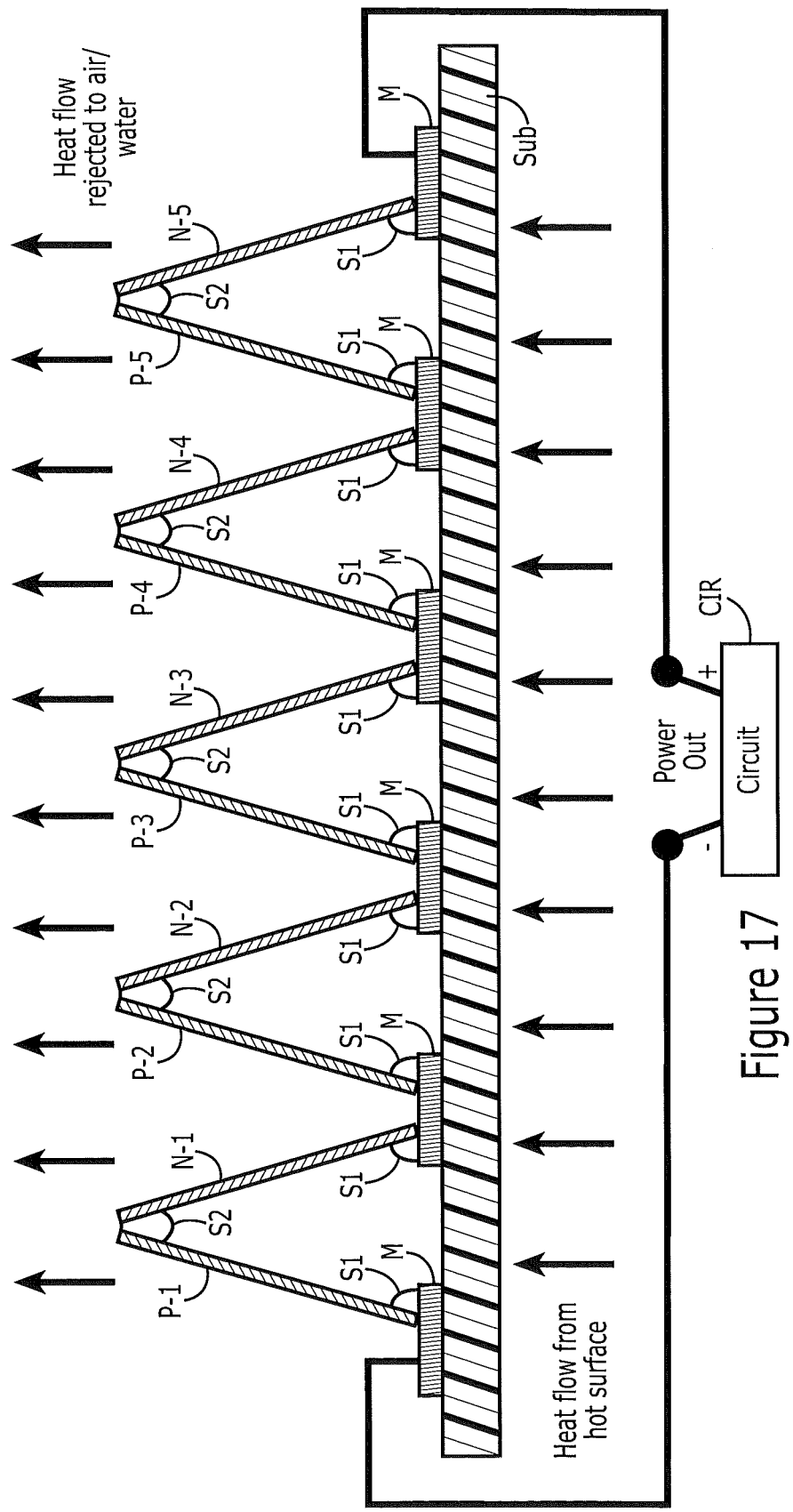

As shown in FIG. 17, the structure of FIG. 16 may be used in a power generation mode with heat being applied to a backside of thermally conductive substrate Sub. The heat may flow from substrate Sub through thermoelectric elements P and N and then to a cooler fluid/ambient environment (e.g., air, water, etc.) adjacent the thermoelectric elements P and N (as indicated by arrows).

The structure of FIGS. 16 and 17 provides a series electrical coupling of alternating P-type and N-type thermoelectric elements P and N with a direction of current flow through P-type elements relative to substrate Sub being substantially opposite a direction of current flow through N-type elements relative to substrate Sub. Accordingly, the illustrated transfer of heat may result in generation of electrical power (indicated as Power Out).

Figure 18:
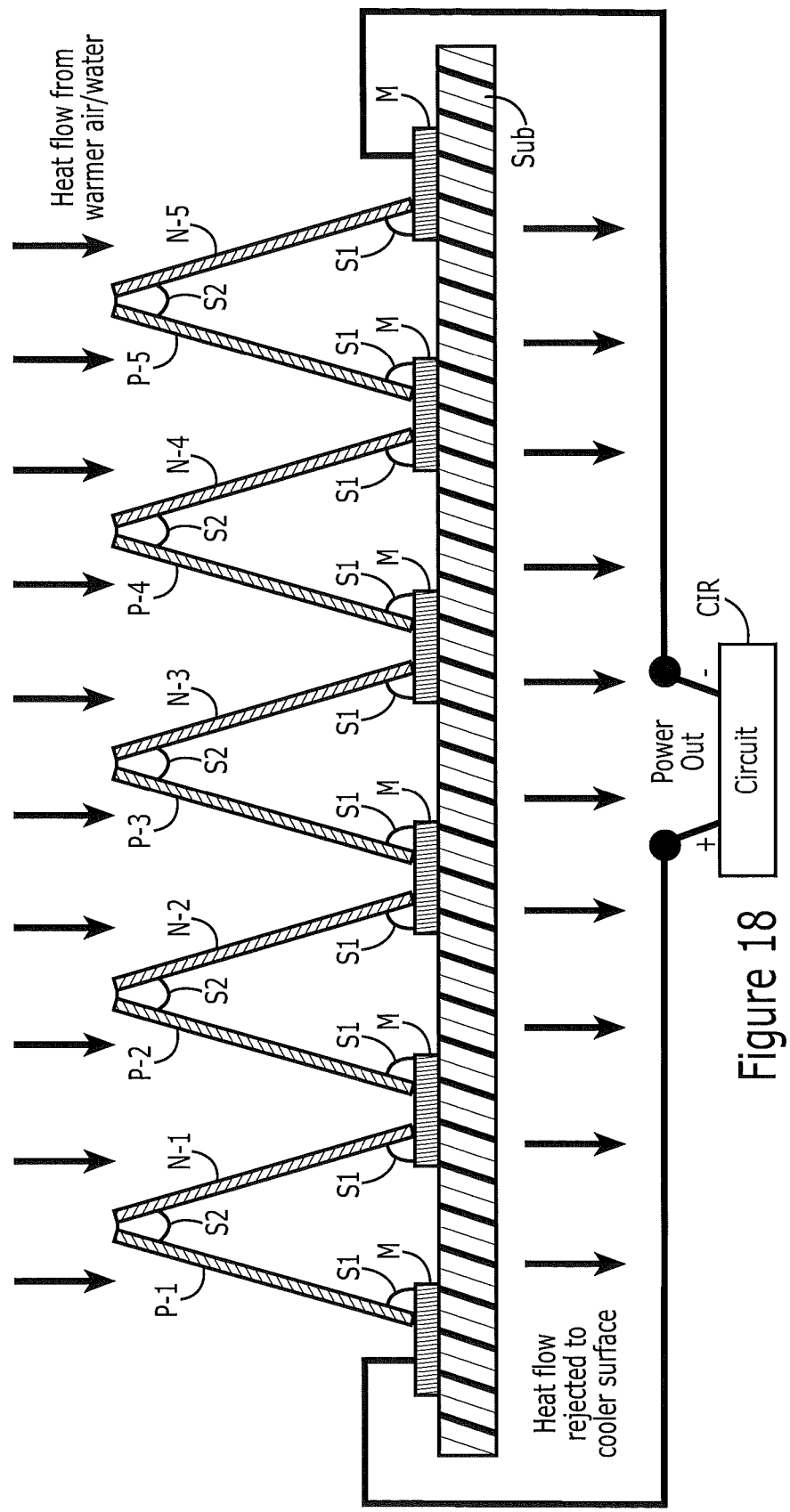

As shown in FIG. 18, the structure of FIG. 16 may also be used in a power generation mode with heat being applied from an fluid/ambient environment (e.g., water, air, etc.). The heat may be absorbed by thermoelectric elements P and N and flow through substrate Sub to a cooler environment on an opposite side of substrate Sub as indicated by arrows. Operations of heat generation in FIG. 18 are similar to operations of FIG. 17 with the difference being that directions of current and heat flow and polarities of power generated are reversed.

As further shown in FIGS. 17 and 18, electrical circuit CIR may be electrically coupled with the p-type and n-type thermoelectric elements, and electrical circuit CIR may be configured to receive electrical energy generated by the plurality thermoelectric elements responsive to a temperature gradient across the thermoelectric elements. Electrical circuit CIR, for example, may be a power supply configured to provide electrical power (e.g., at a specified voltage and/or current level) for an electronic device (e.g., a watch, a calculator, etc.). In addition or in an alternative, electrical circuit CIR may provide electrical charging for a battery coupled thereto. By providing the structure of FIGS. 17 and/or 18, an electronic device including thermoelectric elements P-1 to P-5 and N-1 to N-5 and circuit CIR may be thermally coupled to a fluid/ambient environment adjacent the thermoelectric elements without a solid heat conducting structure between the thermoelectric elements and the fluid/ambient environment so that electrical energy is generated by the thermoelectric elements responsive to the temperature gradient between the thermally conductive substrate and the fluid/ambient environment.

Figure 19:
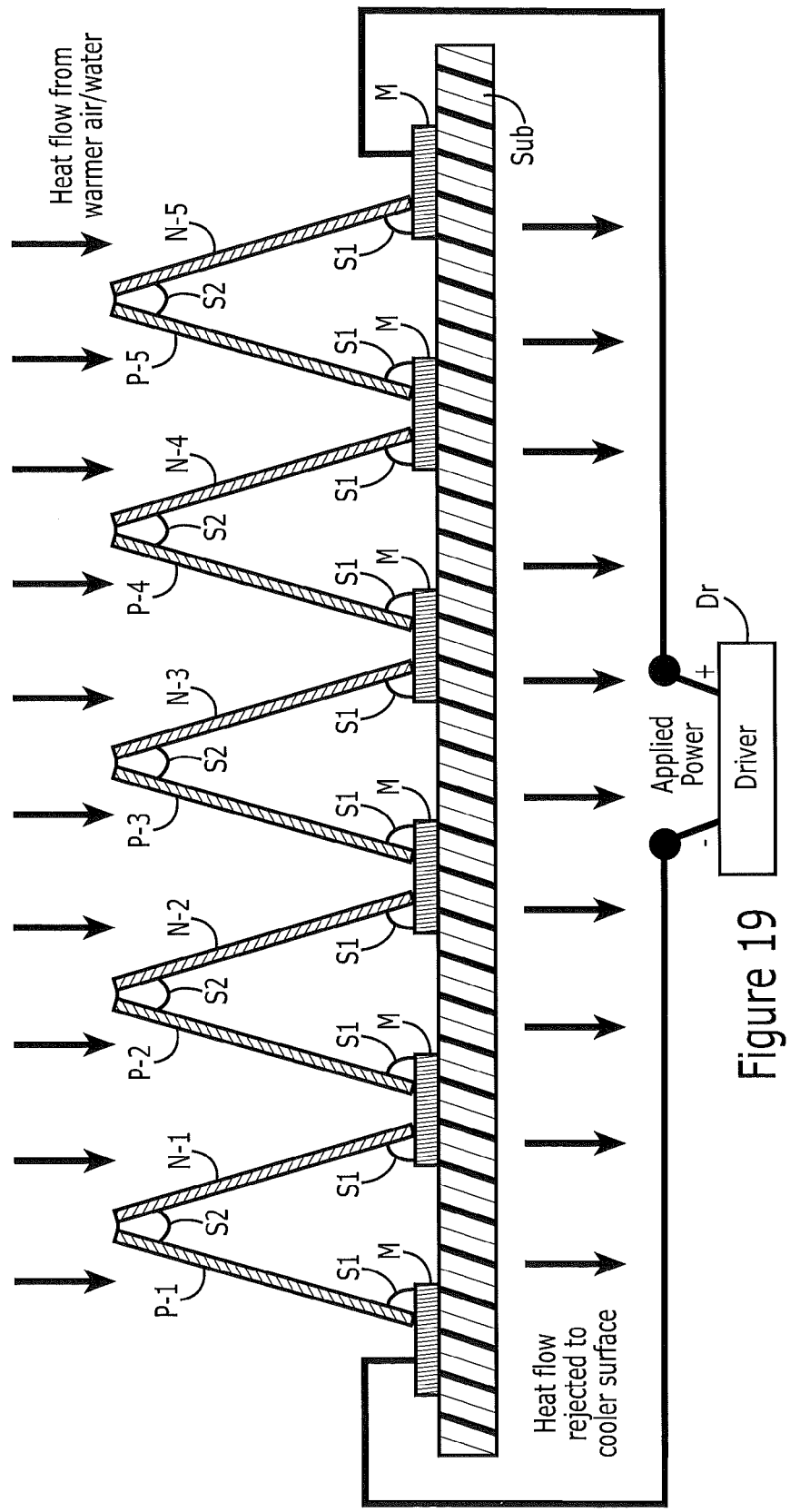
Figure 20:
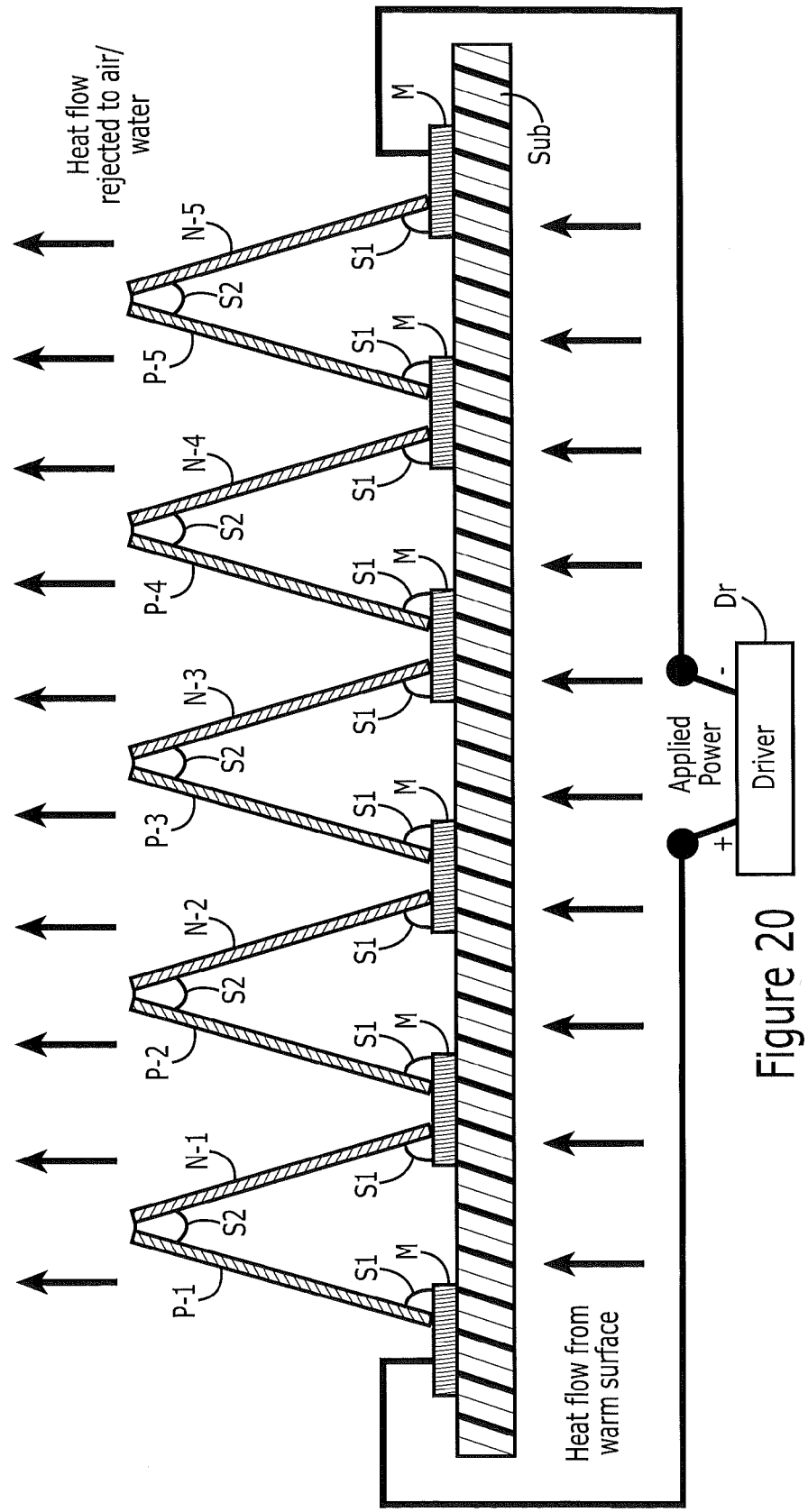

FIGS. 19 and 20 illustrate the structure of FIG. 16 used to pump heat. By providing a first polarity of input electrical power from driver circuit Dr as shown in FIG. 19, the device may operate in a cooling mode absorbing heat from an ambient adjacent thermoelectric elements P-1 to P-5 and N-1 to N-5 and pumping the heat through substrate Sub as indicated by arrows. By providing a second polarity of input electrical power from driver circuit Dr as shown in FIG. 20, the device may operate in a cooling mode absorbing heat from substrate Sub and pumping the heat into an ambient adjacent thermoelectric elements P and N as indicated by arrows.

As shown in FIGS. 17 and 18, electrical driver circuit Dr may be electrically coupled with the p-type and n-type thermoelectric elements, and electrical driver circuit Dr may be configured to provide electrical energy to drive an electrical current through the plurality thermoelectric elements thereby pumping heat through the thermoelectric elements between the fluid/ambient environment and substrate Sub.

Electrical driver circuit Dr, for example, may be configured to control a current through the thermoelectric elements to maintain a relatively stable temperature for a device (e.g., a integrated circuit and/or semiconductor electronic device) thermally coupled to a surface of the substrate opposite the thermoelectric elements. According to some embodiments, substrate Sub may be a semiconductor substrate of an integrated circuit and/or semiconductor electronic device so that an intervening heat spreader is not required. By providing the structure of FIGS. 19 and/or 20, an electronic device including thermoelectric elements P-1 to P-5 and N-1 to N-5 and electronic driver circuit Dr may be thermally coupled to a fluid/ambient environment adjacent the thermoelectric elements without a solid heat conducting structure between the thermoelectric elements and the fluid/ ambient environment so that heat is pumped directly to/from the fluid/ambient environment.

The thermoelectric elements of embodiments of the present invention may be formed of epitaxial thin film thermoelectric materials (such as bismuth telluride) to provide substantially single crystal thin film thermoelectric elements or TEs. A thin film thermoelectric heating/cooling module may include thin film thermoelectric elements or TEs (such as thin film single crystal or epitaxial bismuth telluride TEs) having a thickness on the order of 10 µm and a length and/or width on the order of 200 µm. Thermoelectric element (TE) and thermoelectric heating/cooling structures are discussed by way of example in U.S. Publication No. 2006/0289052 entitled "Methods Of Forming Thermoelectric Devices Including Conductive Posts And/Or Different Solder Materials And Related Methods And Structures" to O'Quinn et al., and U.S. Publication No. 2009/0072385 entitled "Electronic Assemblies Providing Active Side Heat Pumping And Related Methods And Structures" to Alley et al. The disclosures of both of these patent publications are hereby incorporated herein in their entirety by reference.

While single crystal and/or epitaxial thin film thermoelectric elements are discussed by way of example, thermoelectric elements of embodiments of the present invention may be formed of polycrystalline and/or amorphous thermoelectric material. For example, thin film thermoelectric elements may be formed using a thermal and/or plasma spray. Moreover, thermoelectric structures/devices discussed herein may be formed using planar thermoelectric elements that are formed separately and then assembled on (e.g., soldered to) a thermally conductive substrate. According to other embodiments, microelectromechanical system (MEMS) fabrication techniques may be used. For example, thin film thermoelectric elements may be formed/placed on a thermally conductive substrate with a stress inducing layer thereon. With one end of each thermoelectric element anchored to the thermally conductive substrate, the stress inducing layer may cause bending so that the unanchored end of each thermoelectric element is pulled away from the substrate. In an alternative, thin film thermoelectric elements may be formed/placed on a thermally conductive substrate, and solder at one end of each thermoelectric element may lift the opposite end of the thermoelectric element during reflow due to surface tension. Upon cooling the solder, each thermoelectric element may be secured at one end to the substrate, while the other end is raised off the substrate surface.

When an element is referred to as being coupled or connected to/with another element, it can be directly coupled or connected to/with the other element or intervening elements may also be present. In contrast, if an element is referred to as being directly coupled or connected to/with another element, then no other intervening elements are present. As used herein, the term "and/or" includes any and all combinations of one or more of the associated listed items. The symbol "/" is also used as a shorthand notation for "and/or".

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed above could be termed a second region, layer or section, and similarly, a second region, layer or section could be termed a first region, layer or section without departing from the teachings of the present invention. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Spatially relative terms, such as "bottom", "beneath", "below", "lower", "top", "above", "upper", "top", "higher", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated 90 degrees, elements described as "top" or "bottom" relative to other elements or features would then be oriented to the "right" or "left" of the other elements or features. Similarly, if the device in the figures is rotated 180 degrees, elements described as "top" or "bottom" relative to other elements or features would then be oriented to the "bottom" or "top" of the other elements or features. Thus, the exemplary terms "top" or "bottom" can encompass both an orientation of above and below or left and right. The device may be otherwise oriented (rotated 90 degrees or at other orientations) and the spatially relative descriptors used herein interpreted accordingly.

Many different embodiments are disclosed herein, in connection with the description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. A thermoelectric structure comprising:
a thermally conductive substrate; and
a plurality of thermoelectric elements arranged on a surface of the thermally conductive substrate, wherein each thermoelectric element of the plurality of thermoelectric elements consists of an entirely planar thermoelectric element that is non-parallel and non-orthogonal with respect to the surface of the thermally conductive substrate, wherein each thermoelectric element of the plurality of thermoelectric elements includes first and second opposing surfaces separated by a thickness of the thermoelectric element, wherein for each thermoelectric element of the plurality of thermoelectric elements the first and second opposing surfaces of the thermoelectric element are parallel with respect to each other, wherein for each thermoelectric element of the plurality of thermoelectric elements both of the first and second opposing surfaces of the thermoelectric element are exposed to a fluid environment;

wherein for each thermoelectric element of the plurality of thermoelectric elements both of the first and second opposing surfaces are non-parallel and non-orthogonal with respect to the surface of the thermally conductive substrate, wherein each thermoelectric element of the plurality of thermoelectric elements has the first and second opposing surfaces that are first and second primary surfaces of the thermoelectric element, wherein the first and second primary surfaces are planar, wherein the thermoelectric elements are electrically connected in series and comprise alternating p-type and n-type thermoelectric elements, wherein directly adjacent ones of the alternating p-type and n-type thermoelectric elements define P-N pairs, and wherein the directly adjacent ones of the alternating p-type and n-type thermoelectric elements of each of the P-N pairs are canted in different directions relative to the surface of the substrate.

2. A thermoelectric structure according to claim 1 wherein respective growth axes of the thermoelectric elements are orthogonal with respect to directions of current flow through the thermoelectric elements.

3. A thermoelectric structure according to claim 1 further comprising:
a driver circuit coupled to the thermoelectric elements, wherein the driver circuit is configured to drive an electrical current through the thermoelectric elements to pump heat to/from the thermally conductive substrate.

4. A thermoelectric structure according to claim 3 wherein the thermoelectric elements are thermally coupled to the fluid environment adjacent the thermoelectric elements without a solid heat conducting structure between the thermoelectric elements and the fluid environment so that heat is pumped through the thermoelectric elements between the thermally conductive substrate and the fluid environment.

5. A thermoelectric structure according to claim 1 further comprising:
a circuit coupled to the thermoelectric elements, wherein the circuit is configured to receive electrical energy generated by the plurality of thermoelectric elements responsive to a temperature gradient across the thermoelectric elements.

6. A thermoelectric structure according to claim 5 wherein the thermoelectric elements are thermally coupled to the fluid environment adjacent the thermoelectric elements without a solid heat conducting structure between the thermoelectric elements and the fluid environment so that electrical energy is generated by the thermoelectric elements responsive to the temperature gradient between the thermally conductive substrate and the fluid environment.

7. A thermoelectric structure of claim 1 wherein each thermoelectric element of the plurality of thermoelectric elements comprises a single crystal and/or epitaxial thin film thermoelectric element.

8. A thermoelectric structure of claim 1 wherein adjacent surfaces of the directly adjacent ones of the alternating p-type and n-type thermoelectric elements of each of the P-N pairs are canted toward each other so that portions of the directly adjacent ones of the alternating p-type and n-type thermoelectric elements of each of the P-N pairs adjacent the substrate are spaced apart by a greater distance than portions of the directly adjacent ones of the alternating p-type and n-type thermoelectric elements of each of the P-N pairs more distant from the substrate.

9. A thermoelectric structure according to claim 1, wherein the thermally conductive substrate comprises a first thermally conductive substrate, and wherein the thermoelectric structure is free of a second thermally conductive substrate opposite the first thermally conductive substrate.

10. A thermoelectric structure comprising:
a thermally conductive substrate; and
a plurality of thermoelectric elements arranged on a surface of the thermally conductive substrate, wherein each thermoelectric element of the plurality of thermoelectric elements consists of an entirely planar thermoelectric element that is non-parallel and non-orthogonal with respect to the surface of the thermally conductive substrate, wherein each thermoelectric element of the plurality of thermoelectric elements includes first and second opposing surfaces separated by a thickness of the thermoelectric element, wherein for each thermoelectric element of the plurality of thermoelectric elements the first and second opposing surfaces of the thermoelectric element are parallel with respect to each other, wherein for each thermoelectric element of the plurality of thermoelectric elements both of the first and second opposing surfaces of the thermoelectric element are exposed to a fluid environment, and where aspect ratios of the thermoelectric elements are at least about 100 $cm^{-1}$, wherein for each thermoelectric element of the plurality of thermoelectric elements both of the first and second opposing surfaces of the thermoelectric element are non-parallel and non-orthogonal with respect to the surface of the thermally conductive substrate, wherein each thermoelectric element of the plurality of thermoelectric elements has the first and second opposing surfaces that are first and second primary surfaces of the thermoelectric element, and wherein the first and second primary surfaces are planar, wherein the thermoelectric elements are electrically connected in series and comprise alternating p-type and n-type thermoelectric elements, wherein directly adjacent ones of the alternating p-type and n-type thermoelectric elements define P-N pairs, and wherein the directly adjacent ones of the alternating p-type and n-type thermoelectric elements of each of the P-N pairs are canted in different directions relative to the surface of the substrate.

11. A thermoelectric structure according to claim 10 wherein each thermoelectric element of the plurality of thermoelectric elements comprises a growth axis that is orthogonal to a current flow axis thereof.

12. A thermoelectric structure according to claim 11 wherein a plane comprising the current flow axis of each thermoelectric element of the plurality of thermoelectric elements is oriented obliquely with respect to the surface of the thermally conductive substrate, and wherein for each thermoelectric element of the plurality of thermoelectric elements, both of the first and second opposing surfaces of the thermoelectric element are oriented obliquely with respect to the surface of the thermally conductive substrate.

13. A thermoelectric structure according to claim 10 further comprising:
a driver circuit coupled to the plurality of thermoelectric elements, wherein the driver circuit is configured to drive an electrical current through the plurality of thermoelectric elements to pump heat to/from the thermally conductive substrate.

14. A thermoelectric structure according to claim 13 wherein the plurality of thermoelectric elements are thermally coupled to the fluid environment adjacent the plurality of thermoelectric elements without a solid heat conducting structure between the plurality of thermoelectric elements and the fluid environment so that heat is pumped through the plurality of thermoelectric elements between the thermally conductive substrate and the fluid environment.

15. A thermoelectric structure according to claim 10 further comprising: a circuit coupled to the plurality of thermoelectric elements, wherein the circuit is configured to receive electrical energy generated by the plurality of thermoelectric elements responsive to a temperature gradient across the plurality of thermoelectric elements.

16. A thermoelectric structure according to claim 15 wherein the plurality of thermoelectric elements are thermally coupled to the fluid environment adjacent the plurality of thermoelectric elements without a solid heat conducting structure between the plurality of thermoelectric elements and the fluid environment so that electrical energy is generated by the plurality of thermoelectric elements responsive to the temperature gradient between the thermally conductive substrate and the fluid environment.

17. A thermoelectric structure of claim 10 wherein each thermoelectric element of the plurality of thermoelectric elements comprises a single crystal and/or epitaxial thin film thermoelectric element.

18. A thermoelectric structure of claim 10 wherein adjacent surfaces of the directly adjacent ones of the alternating p-type and n-type thermoelectric elements of each of the P-N pairs are canted toward each other so that portions of the directly adjacent ones of the alternating p-type and n-type thermoelectric elements of each of the P-N pairs adjacent the substrate are spaced apart by a greater distance than portions of the directly adjacent ones of the alternating p-type and n-type thermoelectric elements of each of the P-N pairs more distant from the substrate.

19. A thermoelectric structure according to claim 10, wherein the thermally conductive substrate comprises a first thermally conductive substrate, and wherein the thermoelectric structure is free of a second thermally conductive substrate opposite the first thermally conductive substrate.

* * * * *